US012719439B2

(12) United States Patent
Nagatomo

(10) Patent No.: US 12,719,439 B2
(45) Date of Patent: Aug. 25, 2026

(54) ACOUSTIC WAVE DEVICE

(71) Applicant: Murata Manufacturing Co., Ltd., Nagaokakyo (JP)

(72) Inventor: Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 138 days.

(21) Appl. No.: 18/627,883

(22) Filed: Apr. 5, 2024

(65) Prior Publication Data

US 2024/0250657 A1 Jul. 25, 2024

Related U.S. Application Data

(63) Continuation of application No. PCT/JP2022/037725, filed on Oct. 7, 2022.

(60) Provisional application No. 63/253,596, filed on Oct. 8, 2021.

(51) Int. Cl.
*H03H 9/02* (2006.01)

(52) U.S. Cl.
CPC .... *H03H 9/02157* (2013.01); *H03H 9/02015* (2013.01); *H03H 9/02086* (2013.01)

(58) Field of Classification Search
CPC ........... H03H 9/02157; H03H 9/02015; H03H 9/02086; H03H 9/02228; H03H 9/02574; H03H 9/145; H03H 9/25
USPC .................................................. 333/193–196
See application file for complete search history.

(56) References Cited

U.S. PATENT DOCUMENTS

2012/0198672 A1 8/2012 Ueda et al.
2013/0057360 A1 3/2013 Meltaus et al.
2014/0152145 A1 6/2014 Kando et al.
2017/0214387 A1* 7/2017 Burak ................ H03H 9/02118
(Continued)

FOREIGN PATENT DOCUMENTS

JP 2012165132 A 8/2012
JP 2012257019 A 12/2012
(Continued)

OTHER PUBLICATIONS

International Search Report in PCT/JP2022/037725, mailed Nov. 29, 2022, 3 pages.

(Continued)

*Primary Examiner* — Jorge L Salazar, Jr.
(74) *Attorney, Agent, or Firm* — Keating & Bennett, LLP

(57) ABSTRACT

An acoustic wave device includes a support with a thickness in a first direction, a piezoelectric layer extending in the first direction, and a functional electrode on a main surface of the piezoelectric layer and including first electrode fingers extending in a second direction intersecting with the first direction, a first busbar electrode connected to the first electrode fingers, second electrode fingers facing any of the first electrode fingers in a third direction perpendicular or substantially perpendicular the second direction and extending in the second direction, and a second busbar electrode connected to the second electrode fingers. The piezoelectric layer includes a first piezoelectric body in contact with the functional electrode and a second piezoelectric body with a different dielectric polarization than that of the first piezoelectric body, and a thickness of the first piezoelectric body is less than or equal to a thickness of the second piezoelectric body.

19 Claims, 20 Drawing Sheets

(56) References Cited

U.S. PATENT DOCUMENTS

| | | | | |
|---|---|---|---|---|
| 2020/0169242 | A1* | 5/2020 | Nozoe | H03H 9/02866 |
| 2020/0212876 | A1 | 7/2020 | Goto et al. | |
| 2020/0304102 | A1* | 9/2020 | Kanazawa | H03H 9/725 |
| 2020/0366270 | A1* | 11/2020 | Matsuoka | H03H 9/02275 |

FOREIGN PATENT DOCUMENTS

| | | | |
|---|---|---|---|
| JP | 2013528996 | A | 7/2013 |
| JP | 2020109957 | A | 7/2020 |
| WO | 2012073871 | A1 | 6/2012 |

OTHER PUBLICATIONS

Written Opinion in PCT/JP2022/037725, mailed Nov. 29, 2022, 4 pages.

* cited by examiner

ACOUSTIC WAVE DEVICE

CROSS REFERENCE TO RELATED APPLICATIONS

This application claims the benefit of priority to Provisional Application No. 63/253,596 filed on Oct. 8, 2021 and is a Continuation application of PCT Application No. PCT/JP2022/037725 filed on Oct. 7, 2022. The entire contents of each application are hereby incorporated herein by reference.

BACKGROUND OF THE INVENTION

1. Field of the Invention

The present disclosure relates to an acoustic wave device.

2. Description of the Related Art

Japanese Unexamined Patent Application Publication No. 2012-257019 describes an acoustic wave device.

SUMMARY OF THE INVENTION

In the acoustic wave device shown in Japanese Unexamined Patent Application Publication No. 2012-257019, two types of piezoelectric bodies with different polarization axes (orientation axes) may be bonded to be used as a piezoelectric layer. In this case, undesired waves are not curbed, undesired waves are strongly generated on the low-frequency side of the main mode, and frequency characteristics may be degraded.

Example embodiments of the present invention curb degradation of frequency characteristics.

An acoustic wave device according to an aspect of an example embodiment of the present invention includes a support with a thickness in a first direction, a piezoelectric layer extending in the first direction of the support, a functional electrode on a main surface of the piezoelectric layer and including one or more first electrode fingers extending in a second direction intersecting with the first direction, a first busbar electrode to which the one or more first electrode fingers are connected, one or more second electrode fingers facing any of the one or more first electrode fingers in a third direction perpendicular or substantially perpendicular the second direction and extending in the second direction, and a second busbar electrode to which the one or more second electrode fingers are connected, in which the piezoelectric layer is a piezoelectric laminated structure including a first piezoelectric body in contact with the functional electrode and a second piezoelectric body with a state of dielectric polarization different from the first piezoelectric body, and a thickness of the first piezoelectric body is less than or equal to a thickness of the second piezoelectric body.

According to example embodiments of the present disclosure, degradation of frequency characteristics can be curbed.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Example embodiments of the present disclosure are described in detail below based on the drawings. Note that the present disclosure is not limited by these example embodiments. Note that the example embodiments described in the present disclosure are merely exemplary, and in and after a second example embodiment and modifications in which the configurations of different example embodiments are partly replaceable or combinable, descriptions of matters common to the first example embodiment are omitted, and only differences from the first example embodiment are described. Specifically, operations and advantageous effects of the same configurations are not described in every example embodiment.

First Example Embodiment

Figure 1A:
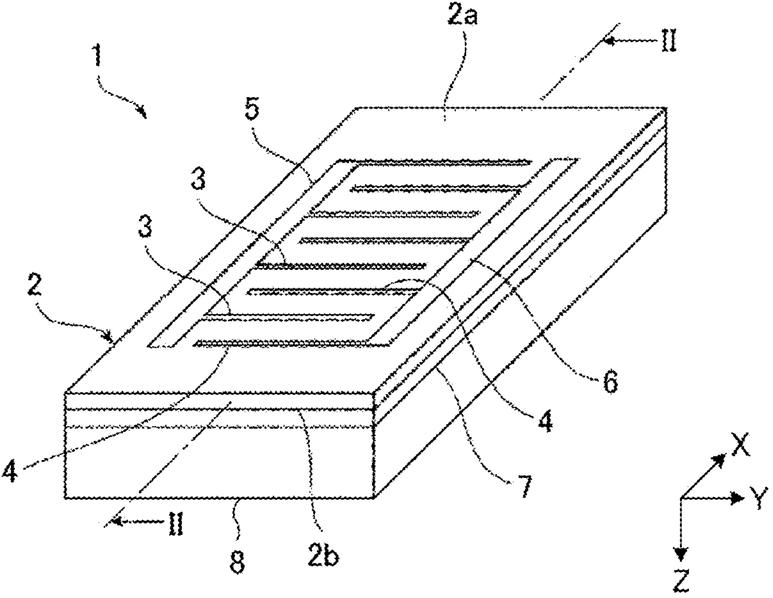
FIG. 1A is a perspective view showing an acoustic wave device of a first example embodiment of the present invention.
Figure 1B:
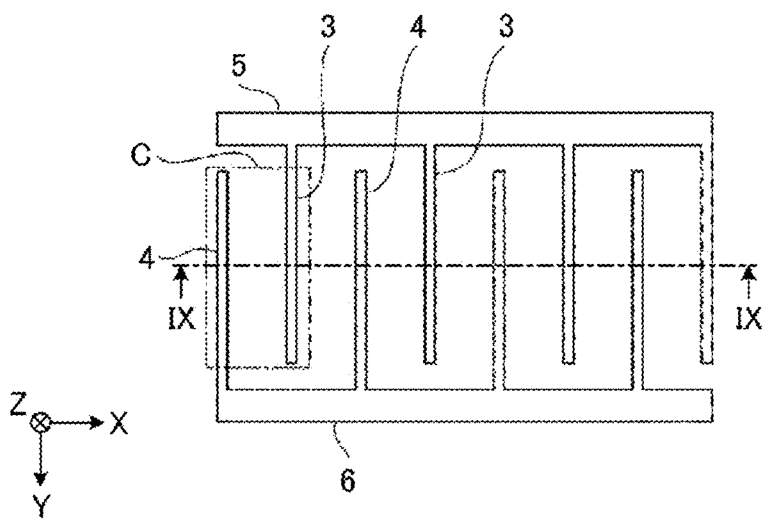
FIG. 1B is a plan view showing an electrode structure of the first example embodiment of the present invention.

FIG. 1A is a perspective view showing an acoustic wave device of a first example embodiment. FIG. 1B is a plan view showing the electrode structure of the first example embodiment.

An acoustic wave device 1 of the first example embodiment has a piezoelectric layer 2 formed of $LiNbO_3$. The piezoelectric layer 2 may be formed of $LiTaO_3$. The cut-angle of $LiNbO_3$ or $LiTaO_3$ is, in the first example embodiment, Z-cut. The cut-angle of $LiNbO_3$ or $LiTaO_3$ may be rotated Y-cut or may be X-cut. The propagation orientation is preferably approximately ±30° of Y-propagation and X-propagation, for example.

The thickness of the piezoelectric layer 2 is not limited to a particular thickness, but in order to effectively excite the first-order thickness shear mode, is preferably about 50 nm or above and about 1000 nm or below, for example.

The piezoelectric layer 2 has a first main surface 2*a* and a second main surface 2*b* facing each other in the Z-direction. Electrode fingers 3 and electrode fingers 4 are provided on the first main surface 2*a*.

The electrode fingers 3 are an example of the "first electrode finger," and the electrode fingers 4 are an example of the "second electrode finger". In FIGS. 1A and 1B, the plurality of electrode fingers 3 are a plurality of "first electrode fingers" connected to a first busbar electrode 5. The plurality of electrode fingers 4 are a plurality of "second electrode fingers" connected to a second busbar electrode 6. The plurality of electrode fingers 3 and the plurality of electrode fingers 4 interdigitate with each other. An interdigital transducer (IDT) electrode including the electrode fingers 3, the electrode fingers 4, the first busbar electrode 5, and the second busbar electrode 6 is thus configured.

The electrode fingers 3 and the electrode fingers 4 have a rectangular or substantially rectangular shape and have a lengthwise direction. In a direction perpendicular or substantially perpendicular this lengthwise direction, the electrode fingers 3 and the electrode fingers 4 adjacent to the electrode fingers 3 face each other. The lengthwise direction of the electrode fingers 3 and the electrode fingers 4 and the direction perpendicular or substantially perpendicular the lengthwise direction of the electrode fingers 3 and the electrode fingers 4 are directions intersecting with a thickness direction of the piezoelectric layer 2. Thus, it can also be said that the electrode fingers 3 and the electrode fingers 4 adjacent to the electrode fingers 3 face each other in a direction intersecting with the thickness direction of the piezoelectric layer 2. In the descriptions below, the thickness direction of the piezoelectric layer 2 may be referred to as a Z-direction (or a first direction), the lengthwise direction of the electrode fingers 3 and the electrode fingers 4 may be referred to as a Y-direction (or a second direction), and the direction perpendicular or substantially perpendicular the length direction of the electrode fingers 3 and the electrode fingers 4 may be referred to as an X-direction (or a third direction).

Also, the lengthwise direction of the electrode fingers 3 and the electrode fingers 4 may be interchanged with the direction perpendicular or substantially perpendicular the lengthwise direction of the electrode fingers 3 and the electrode fingers 4 shown in FIGS. 1A and 1B. In other words, the electrode fingers 3 and the electrode fingers 4 may extend in the direction in which the first busbar electrode 5 and the second busbar electrode 6 extend in FIGS. 1A and 1B. In this case, the first busbar electrode 5 and the second busbar electrode 6 extend in the direction in which the electrode fingers 3 and the electrode fingers 4 extend in FIGS. 1A and 1B. Then, a plurality of structures each being a pair of the electrode finger 3 connected to one potential and the electrode finger 4 connected to the other potential are arranged in the direction perpendicular or substantially perpendicular the lengthwise direction of the electrode fingers 3 and the electrode fingers 4 described above.

A state where the electrode finger 3 and the electrode finger 4 are adjacent to each other refers not to a state where the electrode finger 3 and the electrode finger 4 are arranged in direct contact with each other, but to a state where the electrode finger 3 and the electrode finger 4 are arranged with spacing interposed therebetween. Also, in a case where the electrode finger 3 and the electrode finger 4 are adjacent to each other, electrodes connected to a hot electrode or a ground electrode, including other electrode fingers 3 and electrode fingers 4, are not disposed between the electrode finger 3 and the electrode finger 4. The number of these pairs does not need to be an integer, and there may be 1.5 pairs, 2.5 pairs, and the like.

The center-to-center distance, i.e., the pitch, between the electrode finger 3 and the electrode finger 4 is preferably in the range from about 1 μm or above to about 10 μm or below, for example. The center-to-center distance between the electrode finger 3 and the electrode finger 4 is the distance between the widthwise center of the electrode finger 3 in the direction perpendicular or substantially perpendicular the lengthwise direction of the electrode finger 3 and the widthwise center of the electrode finger 4 in the direction perpendicular or substantially perpendicular the lengthwise direction of the electrode finger 4.

Further, in a case where at least one of the electrode finger 3 and the electrode finger 4 includes a plurality of electrode fingers (in a case where there are 1.5 electrode pairs or more when an electrode pair is formed by the electrode finger 3 and the electrode finger 4), the center-to-center distance between the electrode finger 3 and the electrode finger 4 refers to the average value of the center-to-center distances between each adjacent ones of the 1.5 pairs or more of the electrode finger 3 and the electrode finger 4.

Also, the width of the electrode fingers 3 and the electrode fingers 4, i.e., the dimension of the electrode fingers 3 and the electrode fingers 4 measured in the direction in which they face each other is preferably in the range from about 150 nm or above to about 1000 nm or below, for example. Note that the center-to-center distance between the electrode finger 3 and the electrode finger 4 is the distance between the center of a dimension of the electrode finger 3 measured in the direction perpendicular or substantially perpendicular the lengthwise direction of the electrode finger 3 (the width dimension) and the center of a dimension of the electrode finger 4 measured in the direction perpendicular or substantially perpendicular the lengthwise direction of the electrode finger 4 (the width dimension).

Because a Z-cut piezoelectric layer is used in the first example embodiment, the direction perpendicular or substantially perpendicular the lengthwise direction of the electrode fingers 3 and the electrode fingers 4 is the direction perpendicular or substantially perpendicular the polarization direction of the piezoelectric layer 2. This does not apply if a piezoelectric body of a different cut-angle is used as the piezoelectric layer 2. Herein, being "perpendicular" is not limited to being strictly perpendicular and may mean substantially perpendicular (for example, an angle between the polarization direction and the direction perpendicular or substantially perpendicular the lengthwise direction of the electrode fingers 3 and the electrode fingers 4 is about 90°±10°).

Figure 2:
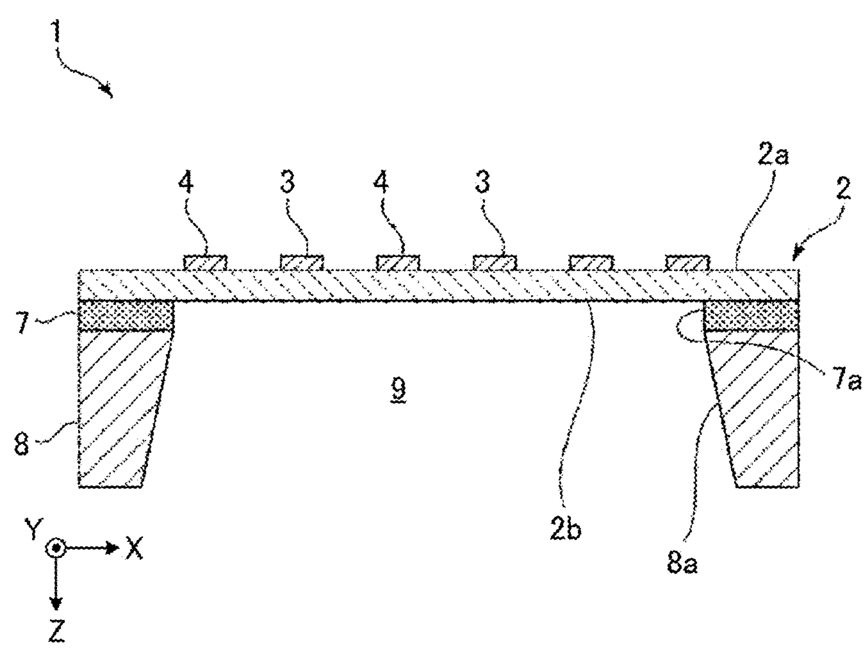
FIG. 2 is a sectional view of a portion taken along the line II-II in FIG. 1A.

A support substrate 8 is laminated on the second main surface 2*b* side of the piezoelectric layer 2 with an intermediate layer 7 interposed therebetween. The intermediate layer 7 and the support substrate 8 have frame shapes and include cavities 7*a*, 8*a* as shown in FIG. 2, thereby defining a void portion (an air gap) 9.

The void portion 9 is provided so as not to hinder vibrations of the piezoelectric layer 2 in an excitation region C. Thus, the above-described support substrate 8 is laminated on the second main surface 2*b* with the intermediate layer 7 interposed therebetween, at a position where the support substrate 8 does not overlap with a portion where at least one pair of the electrode finger 3 and the electrode finger 4 is provided. Note that the intermediate layer 7 does not have to be provided. Thus, the support substrate 8 may be laminated on the second main surface 2*b* of the piezoelectric layer 2 directly or indirectly.

The intermediate layer 7 is formed of silicon oxide, although the intermediate layer 7 can be formed of an appropriate insulating material different from silicon oxide, such as silicon nitride or alumina.

The support substrate 8 is formed of Si. The plane orientation of Si at the plane at the piezoelectric layer 2 side may be (100) or (110) or may be (111). Preferably, Si is desirably one with a high resistivity of about 4 kΩ or above, for example, although the support substrate 8 too can be formed using an appropriate insulating material or semiconductor material. Examples of a material usable as the support substrate 8 include piezoelectric bodies such as aluminum oxide, lithium tantalate, lithium niobate, and crystals, various kinds of ceramics such as alumina, magnesia, sapphire, silicon nitride, aluminum nitride, silicon carbide, zirconia, cordierite, mullite, steatite, and forsterite, dielectrics such as diamond and glass, semiconductors such as gallium nitride.

The pluralities of electrode fingers 3 and electrode fingers 4, the first busbar electrode 5, and the second busbar electrode 6 are each formed of an appropriate metal or metal alloy, such as Al or an AlCu alloy. In the first example embodiment, the electrode fingers 3, the electrode fingers 4, the first busbar electrode 5, and the second busbar electrode 6 have a structure such that an Al film is laminated on a Ti film. A close contact layer other than a Ti film may be used instead.

For driving, an alternating current voltage is applied between the plurality of electrode fingers 3 and the plurality of electrode fingers 4. More specifically, an alternating current voltage is applied between the first busbar electrode 5 and the second busbar electrode 6. This makes it possible to obtain resonance characteristics utilizing bulk waves of the first-order thickness-shear mode excided at the piezoelectric layer 2.

Also, in the acoustic wave device 1, d/p is about 0.5 or below, for example, where d is the thickness of the piezoelectric layer 2, and p is the center-to-center distance between the electrode finger 3 and the electrode finger 4 adjacent to each other among the plurality of pairs of the electrode finger 3 and the electrode finger 4. Thus, the above-described bulk waves of the first-order thickness-shear mode are effectively excited, making it possible to obtain favorable resonance characteristics. More preferably, d/p is about 0.24 or below, for example, and in this case, even more favorable resonance characteristics can be obtained.

Note that in a case where at least one of the electrode finger 3 and the electrode finger 4 includes a plurality of electrode fingers as in the first example embodiment, i.e., in a case where there are 1.5 pairs or more of the electrode finger 3 and the electrode finger 4 when an electrode pair is formed by the electrode finger 3 and the electrode finger 4, the center-to-center distance between the electrode finger 3 and the electrode finger 4 adjacent to each other is the average value of the center-to-center distances between each adjacent ones of the electrode fingers 3 and the electrode fingers 4.

In the acoustic wave device 1 of the first example embodiment having the configuration described above, it is less likely that the Q factor is decreased even if the number of pairs of the electrode finger 3 and the electrode finger 4 is reduced to reduce device size. This is because the resonator does not require reflectors on both sides and therefore experiences less propagation loss. The resonator does not require the reflectors because bulk waves of the first-order thickness-shear mode are used.

Figure 3A:
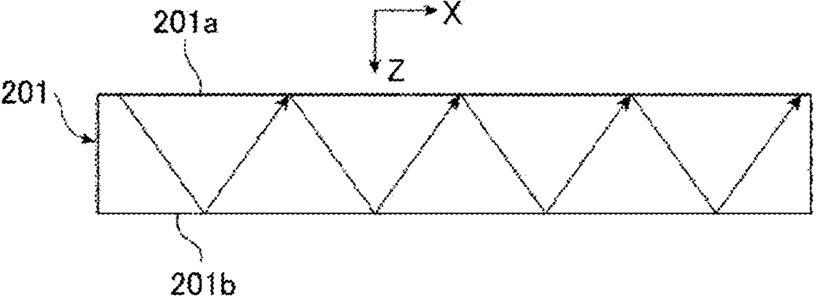
FIG. 3A is a schematic sectional view illustrating Lamb waves propagating in a piezoelectric layer of a comparative example.
Figure 3B:
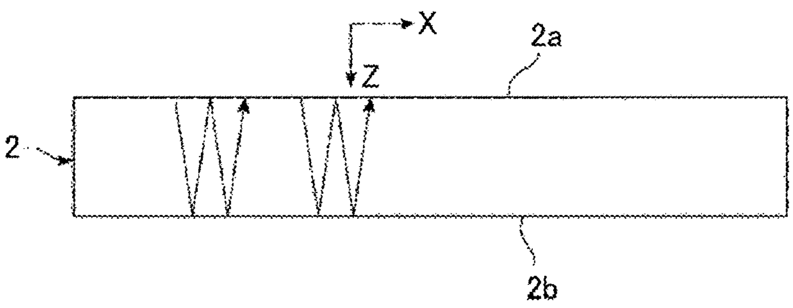
FIG. 3B is a schematic sectional view illustrating bulk waves of the first-order thickness-shear mode propagating in a piezoelectric layer of the first example embodiment of the present invention.
Figure 4:
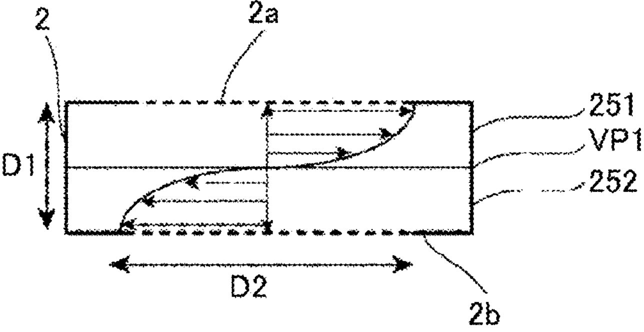
FIG. 4 is a schematic sectional view illustrating the direction of the amplitude of bulk waves of the first-order thickness-shear mode propagating in the piezoelectric layer of the first example embodiment of the present invention.

FIG. 3A is a schematic sectional view illustrating Lamb waves propagating in a piezoelectric layer of a comparative example. FIG. 3B is a schematic sectional view illustrating bulk waves of the first-order thickness-shear mode propagating in the piezoelectric layer of the first example embodiment. FIG. 4 is a schematic sectional view illustrating the direction of the amplitude of bulk waves of the first-order thickness-shear mode propagating in the piezoelectric layer of the first example embodiment.

FIG. 3A is an acoustic wave device like the one described in Japanese Unexamined Patent Application Publication No. 2012-257019, and Lamb waves propagate in the piezoelectric layer. As shown in FIG. 3A, waves propagate in a piezoelectric layer 201 as shown with the arrows. The piezoelectric layer 201 has a first main surface 201*a* and a second main surface 201*b*, and a thickness direction connecting the first main surface 201*a* and the second main surface 201*b* is the Z-direction. The X-direction is a direction in which the electrode fingers 3, 4 of the IDT electrode are arranged. As shown in FIG. 3A, with Lamb waves, the waves propagate in the X-direction as depicted in the diagram. The entire piezoelectric layer 201 vibrates because the waves are plate waves. However, because the waves propagate in the X-direction, reflectors may be provided at both sides to obtain resonance characteristics. For this reason, the waves experience propagation loss, and the Q factor lowers when an attempt for device size reduction is made, i.e., when the number of pairs of the electrode fingers 3, 4 are reduced.

By contrast, in the acoustic wave device of the first example embodiment, as shown in FIG. 3B, vibration displacement is in the thickness-shear direction, and thus, the waves propagate almost in the direction of a line connecting the first main surface 2*a* and the second main surface 2*b* of the piezoelectric layer 2, i.e., in the Z-direction, and resonate. In other words, the X-direction component of the waves is significantly smaller than the Z-direction component. Also, because resonance characteristics are obtained due to this propagation of the waves in the Z-direction, reflectors are not required. Thus, propagation loss which would otherwise occur in propagation to the reflectors does not occur. Thus, it is less likely that the Q factor lowers even if the number of electrode pairs of the electrode finger 3 and the electrode finger 4 is reduced to reduce device size.

Note that the direction of the amplitude of the bulk waves of the first-order thickness-shear mode is, as shown in FIG. 4, opposite between a first region 251 included in the excitation region C in the piezoelectric layer 2 (see FIG. 1B) and a second region 252 included in the excitation region C. FIG. 4 schematically shows bulk waves in a case where a voltage is applied between the electrode fingers 3 and the electrode fingers 4 so that the electrode fingers 4 may be at a higher potential than the electrode fingers 3. The first region 251 is a region, in the excitation region C, between the first main surface 2*a* and a virtual plane VP1 which is perpendicular or substantially perpendicular the thickness direction of the piezoelectric layer 2 and bisects the piezoelectric layer 2. The second region 252 is a region, in the excitation region C, between the virtual plane VP1 and the second main surface 2*b*.

In the acoustic wave device 1, at least one pair of the electrode finger 3 and the electrode finger 4 is disposed. Because waves do not propagate in the X-direction, there is no need to provide a plurality of electrode pairs of the electrode finger 3 and the electrode finger 4. Thus, it suffices if at least one electrode pair is provided.

For example, the electrode finger 3 is an electrode connected to the hot potential, and the electrode finger 4 is an electrode connected to the ground potential, although the electrode finger 3 may be connected to the ground potential and the electrode finger 4 may be connected to the hot potential instead. In the first example embodiment, at least one pair of electrodes is, as described above, an electrode connected to the hot potential or an electrode connected to the ground potential, and no floating electrode is provided.

Figure 5:
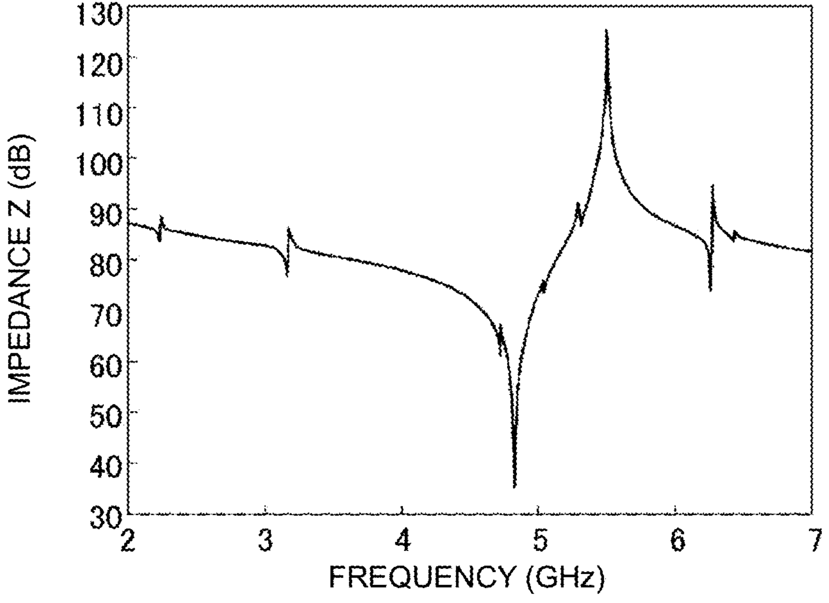
FIG. 5 is an explanatory diagram showing an example of resonance characteristics of the acoustic wave device of the first example embodiment of the present invention.

FIG. 5 is an explanatory diagram showing an example of the resonance characteristics of the acoustic wave device of the first example embodiment. Note that example design parameters for the acoustic wave device 1 achieving the resonance characteristics shown in FIG. 5 are as follows.

The piezoelectric layer 2: $LiNbO_3$ with Euler angles (0°, 0°, 90°)

The thickness of the piezoelectric layer 2: 400 nm

The length of the excitation region C (see FIG. 1B): 40 μm

The number of electrode pairs of the electrode finger 3 and the electrode finger 4: 21 pairs The center-to-center distance (pitch) between the electrode finger 3 and the electrode finger 4: 3 μm The width of the electrode finger 3 and the electrode finger 4: 500 nm d/p: 0.133

The intermediate layer 7: a 1-μm thick silicon oxide film

The support substrate 8: Si

Note that the excitation region C (see FIG. 1B) is a region where the electrode finger 3 and the electrode finger 4 overlap when seen in the X-direction perpendicular or substantially perpendicular the lengthwise direction of the electrode finger 3 and the electrode finger 4. The length of the excitation region C is a dimension measured in the lengthwise direction of the electrode finger 3 and the electrode finger 4 in the excitation region C. The excitation region C is an example of the “overlap region”.

In the first example embodiment, the center-to-center distance of an electrode pair of the electrode finger 3 and the electrode finger 4 is equal among all the plurality of pairs. In other words, the electrode fingers 3 and the electrode fingers 4 are arranged at an equal pitch.

As is apparent in FIG. 5, despite not having reflectors, a fractional band width is about 12.5%, for example, and favorable resonance characteristics are obtained.

In the first example embodiment, d/p is about 0.5 or below or more preferably about 0.24 or below, for example, when d is the thickness of the piezoelectric layer 2 and p is the electrodes' center-to-center distance between the electrode finger 3 and the electrode finger 4. This point is described with reference to FIG. 6.

Figure 6:
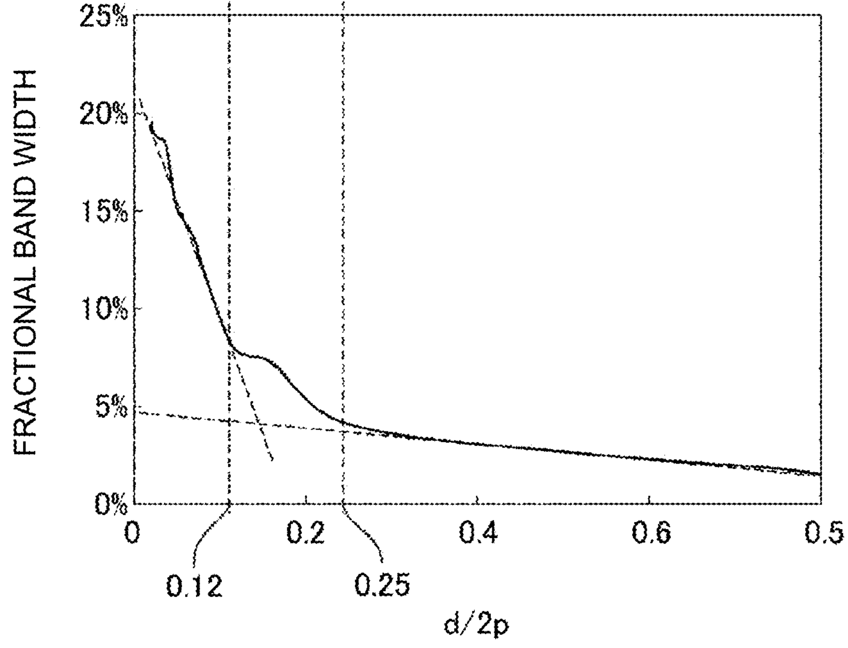
FIG. 6 is an explanatory diagram showing the relation between d/2p and a fractional band width as a resonator in the acoustic wave device of the first example embodiment of the present invention when p is the center-to-center distance of adjacent electrodes or the average distance of the center-to-center distances and d is the average thickness of the piezoelectric layer.

A plurality of acoustic wave devices were obtained in a manner similar to the acoustic wave device that achieved the resonance characteristics shown in FIG. 5, but with different values of d/2p. FIG. 6 is an explanatory diagram showing the relation between d/2p and a fractional band width as a resonator in the acoustic wave device of the first example embodiment when p is the center-to-center distance of adjacent electrodes or the average distance of the center-to-center distances and d is the average thickness of the piezoelectric layer 2.

As shown in FIG. 6, when d/2p exceeds about 0.25, i.e., when d/p>about 0.5, the fractional band width is below about 5% despite the adjustment of d/p, for example. By contrast, when d/2p≤about 0.25, i.e., when d/p≤about 0.5, the fractional band width can be brought to about 5% or higher, for example, when d/p is changed within that range, and thus, a resonator having a high coupling coefficient can be configured. Also, when d/2p is about 0.12 or below, i.e., when d/p is about 0.24 or below, the fractional band width can be increased to about 7% or above, for example. In addition, adjusting d/p within this range makes it possible to obtain a resonator with an even wider fractional band width and therefore achieve a resonator having an even higher coupling coefficient. This shows that when d/p is about 0.5 or below, for example, a resonator utilizing bulk waves of the first-order thickness-shear mode and having a high coupling coefficient may be configured.

Note that the at least one electrode pair may be a single pair, and when there is a single pair of electrodes, p described above is the center-to-center distance between the electrode finger 3 and the electrode finger 4 adjacent to each other. Also, in a case where there are 1.5 electrode pairs or more, p is the average distance of the center-to-center distances of each adjacent ones of the electrode finger 3 and the electrode finger 4.

Regarding the thickness d of the piezoelectric layer 2, if the piezoelectric layer 2 has uneven thickness, the average value of its thickness may be used.

Figure 7:
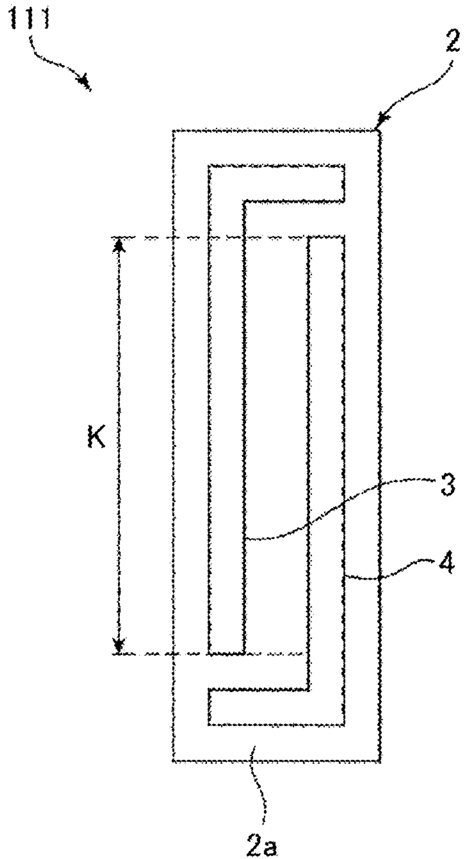
FIG. 7 is a plan view showing an example where a single pair of electrodes is provided in the acoustic wave device of the first example embodiment of the present invention.

FIG. 7 is a plan view showing an example where a single pair of electrodes is provided in the acoustic wave device of the first example embodiment. In an acoustic wave device 101, a single electrode pair having the electrode finger 3 and the electrode finger 4 is provided on the first main surface 2*a* of the piezoelectric layer 2. Note that K in FIG. 7 is an overlap width. As described earlier, the acoustic wave device of the present disclosure may have a single pair of electrodes. In this case as well, bulk waves of the first-order thickness-shear mode can be effectively excited if d/p described above is about 0.5 or below, for example.

Preferably, the acoustic wave device 1 desirably satisfies MR≤about 1.75(d/p)+0.075 where MR is the metallization ratio of any adjacent ones of the plurality of electrode fingers 3 and the plurality of electrode fingers 4 to the excitation region C which is a region where the electrode finger 3 and the electrode finger 4 adjacent to each other overlap when seen in a direction in which the electrode finger 3 and the electrode finger 4 face each other. In this case, a spurious mode can be effectively reduced. This point is described with reference to FIGS. 8 and 9.

Figure 8:
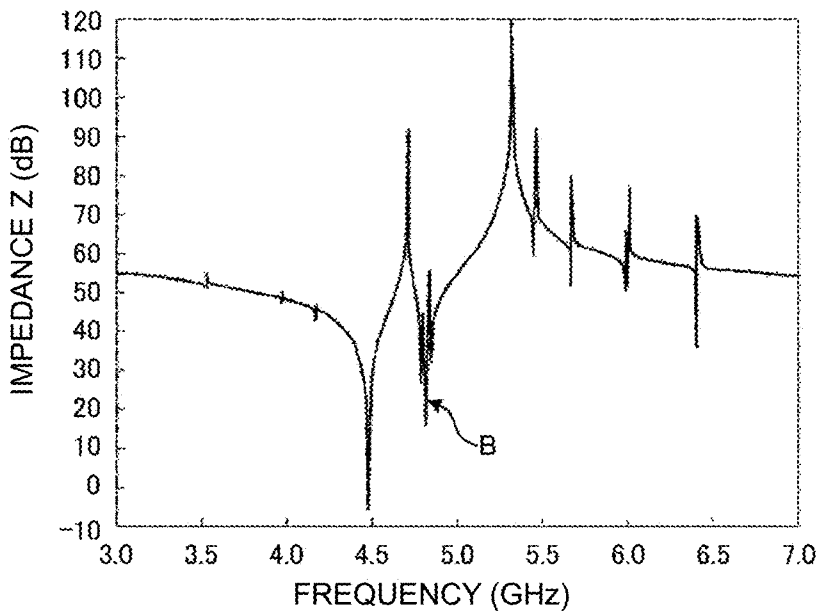
FIG. 8 is a reference diagram showing an example of the resonance characteristics the acoustic wave device of the first example embodiment of the present invention.

FIG. 8 is a reference diagram showing an example of the resonance characteristics of the acoustic wave device of the first example embodiment. A spurious mode indicated with arrow B appears between the resonant frequency and the anti-resonant frequency. Note that d/p=about 0.08, and $LiNbO_3$ has Euler angles (0°, 0°, 90°), for example. Also, the metallization ratio MR=about 0.35, for example.

The metallization ratio MR is described with reference to FIG. 1B. In the electrode structure in FIG. 1B, focusing on a single pair of the electrode finger 3 and the electrode finger 4, it is assumed that only this single pair of the electrode finger 3 and the electrode finger 4 is provided. In this case, a portion surrounded by the dot-dash line is the excitation region C. This excitation region C is a region of the electrode finger 3 overlapping with the electrode finger 4, a region of the electrode finger 4 overlapping with the electrode finger 3, and a region where the electrode finger 3 and the electrode finger 4 overlap with each other in a region between the electrode finger 3 and the electrode finger 4, when the electrode finger 3 and the electrode finger 4 are seen in a direction perpendicular or substantially perpendicular the lengthwise direction of the electrode finger 3 and the electrode finger 4, i.e., in a direction in which they face each other. Then, the area of the electrode finger 3 and the electrode finger 4 within this excitation region C in relation to the area of the excitation region C is the metallization ratio MR. In other words, the metallization ratio MR is the ratio of the area of the metallization portion to the area of the excitation region C.

Note that in a case where a plurality of pairs of the electrode finger 3 and the electrode finger 4 are provided, MR is the proportion of the metallization portions included in the entire excitation region C to the total area of the excitation region C.

Figure 9:
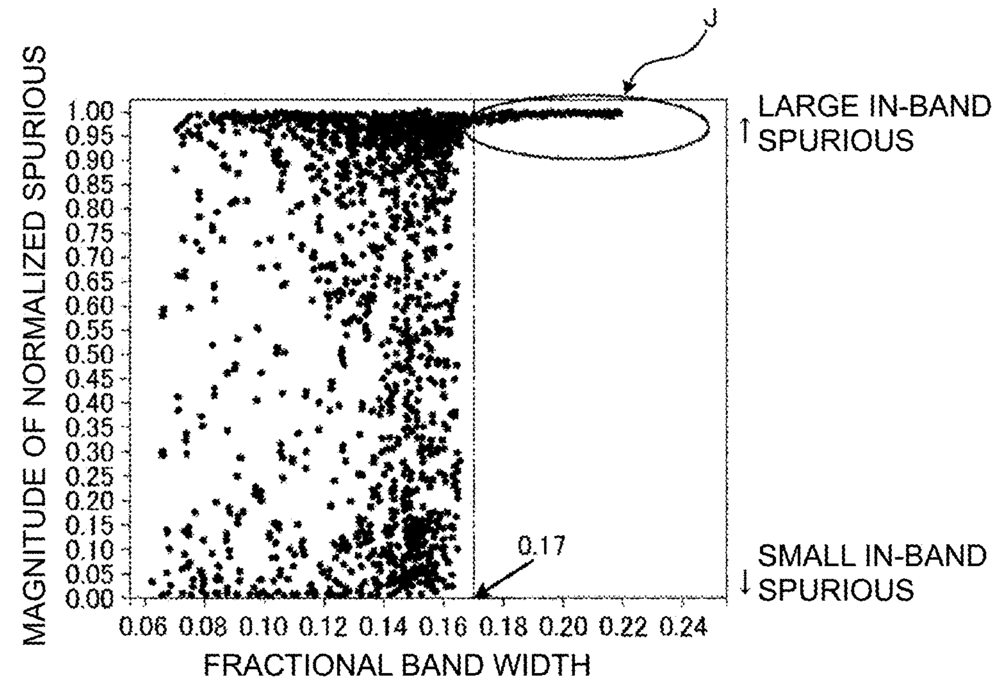
FIG. 9 is an explanatory diagram showing the relation, in the acoustic wave device of the first example embodiment of the present invention, between a fractional band width in a case where a large number of acoustic wave resonators are configured and the amount of phase rotation of spurious impedance normalized by 180° as spurious size.

FIG. 9 is an explanatory diagram showing the relation, in the acoustic wave device of the first example embodiment, between the fractional band width in a case where a large number of acoustic wave resonators are configured and the amount of phase rotation of spurious impedance normalized by 180° as spurious size. Note that the fractional band width was adjusted by variously changing the film thickness of the piezoelectric layer 2 and the dimensions of the electrode fingers 3 and the electrode fingers 4. Also, although FIG. 9 shows results obtained in a case of using the piezoelectric layer 2 formed of Z-cut $LiNbO_3$, similar tendencies are observed in a case of using the piezoelectric layer 2 of other cut-angles.

In the region surrounded by the oval J in FIG. 9, the spurious mode is about 1.0 and large, for example. As is apparent in FIG. 9, when the fractional band width exceeds about 0.17, i.e., exceeds about 17%, for example, a spurious mode with a spurious level of 1 or above appears in the pass band even if the parameters forming the fractional band width are changed. In other words, like the resonance characteristics shown in FIG. 8, a large spurious mode indicated by the arrow B appears in the band. Thus, the fractional band width is preferably about 17% or below, for example. In this case, the spurious mode can be reduced by adjustment of, e.g., the film thickness of the piezoelectric layer 2 and the dimensions of the electrode fingers 3 and the electrode fingers 4.

Figure 10:
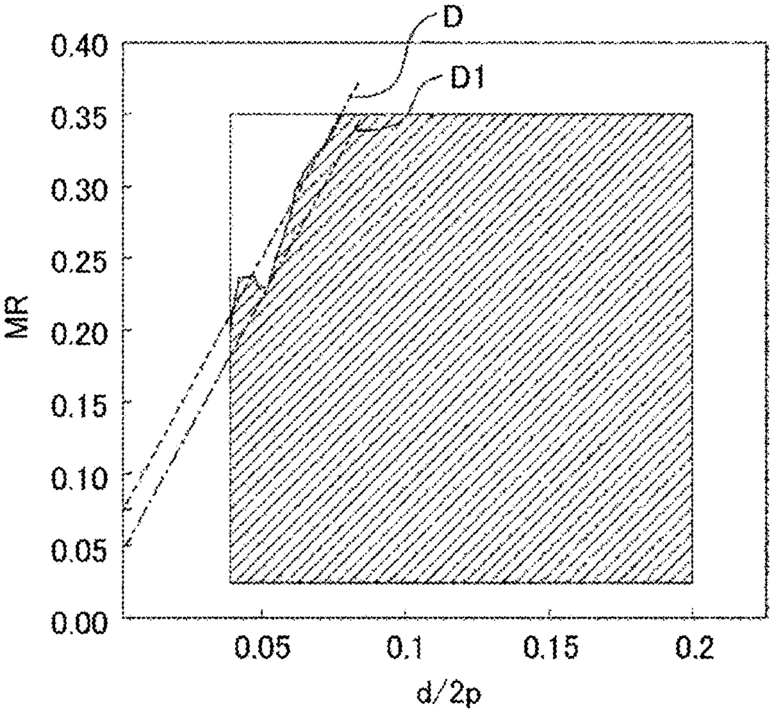
FIG. 10 is an explanatory diagram showing the relation between d/2p, a metallization ratio MR, and a fractional band width.

FIG. 10 is an explanatory diagram showing an example of the relation between d/2p, the metallization ratio MR, and the fractional band width. As the acoustic wave device 1 of the first example embodiment, various acoustic wave devices 1 were formed with different values of d/2p and MR, and their fractional band widths were measured. The hatched portion on the right side of the broken line D in FIG. 10 is the region where the fractional band width is about 17% or below, for example. The border between this hatched region and a non-hatched region is expressed by MR=about 3.5(d/2p)+0.075. Hence, MR=about 1.75(d/p)+0.075. Thus, preferably, MR≤about 1.75(d/p)+0.075. This makes it easy to bring the fractional band width to about 17% or below. More preferable is the region on the right side of MR=about 3.5(d/2p)+0.05 indicated by the dot-dash line D1 in FIG. 10. Thus, if MR≤about 1.75(d/p)+0.05, the fractional band width can be brought to about 17% or below with reliability.

Figure 11:
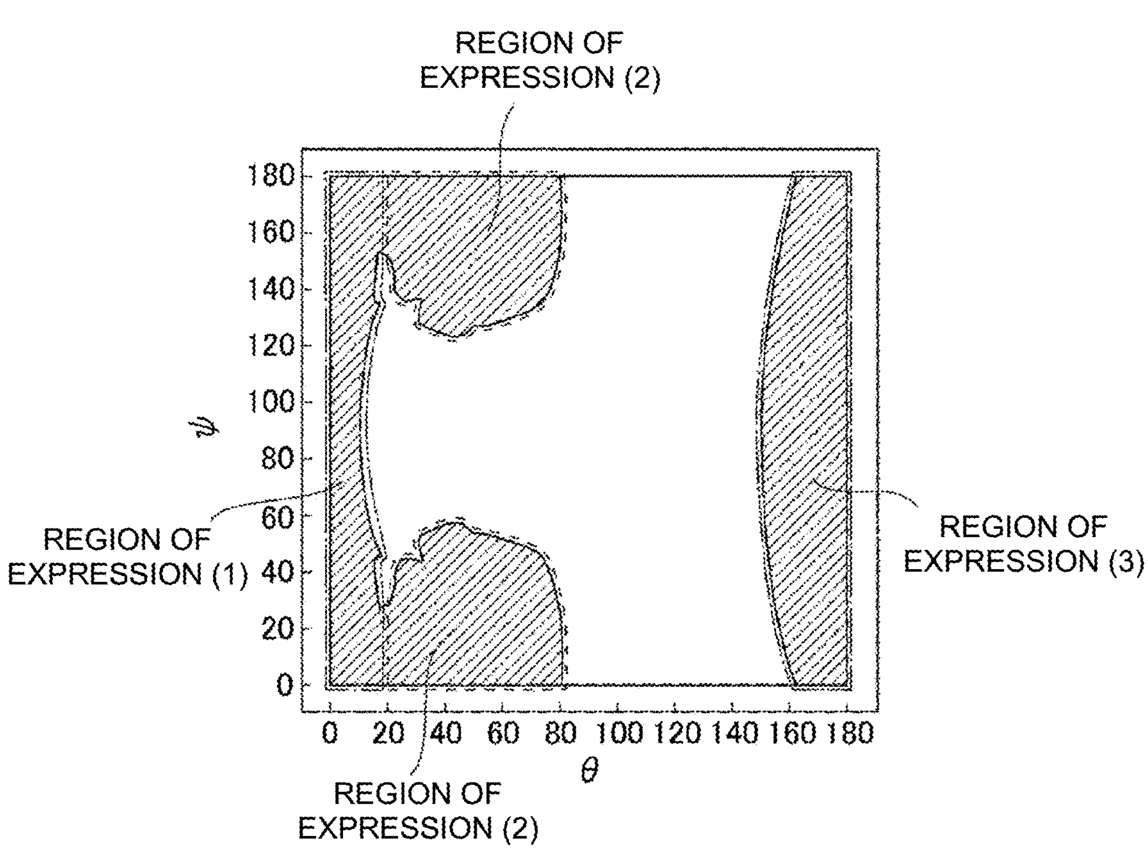
FIG. 11 is an explanatory diagram showing a map of a fractional band width in relation to the Euler angles (0°, θ, ψ) of $LiNbO_3$ in a case where d/p is brought to almost zero.

FIG. 11 is an explanatory diagram showing a map of the fractional band width in relation to the Euler angles (0°, θ, ψ) of $LiNbO_3$ in a case where d/p is brought to almost zero. The hatched portions in FIG. 11 are regions where fractional band widths of at least about 5% or above are obtained, for example. Approximation of the ranges of the regions yields ranges expressed by Formulae (1), (2), and (3) below.

$$(0° \pm 10°,\ 0° \text{ to } 20°,\ \text{any given } \psi) \qquad \text{Formula (1)}$$

$$\left(0° \pm 10°,\ 20° \text{ to } 80°,\ 0° \text{ to } 60°\left(1-(\theta-50)^2/900\right)^{1/2}\right) \text{ or } \qquad \text{Formula (2)}$$

$$\left(0° \pm 10°,\ 20° \text{ to } 80°,\ \left[180° - 60°\left(1-(\theta-50)^2/900\right)^{1/2}\right] \text{ to } 180°\right)$$

$$\text{Formula (3)}$$

$$\left(0° \pm 10°,\ \left[180° - 30°\left(1-(\psi-90)^2/8100\right)^{1/2}\right] \text{ to } 180°,\ \text{any given } \psi\right)$$

Thus, the range of Euler angles of Formula (1), (2), or (3) is preferable because the fractional band width can be widened sufficiently.

Figure 12:
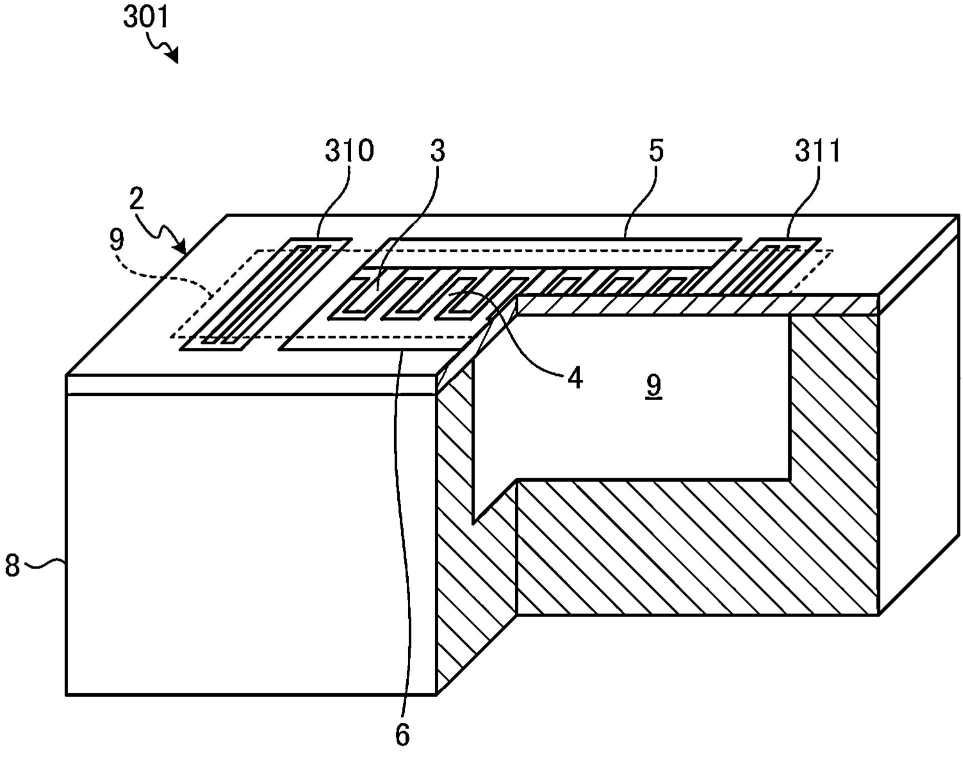
FIG. 12 is a partially cut-away perspective view illustrating an acoustic wave device according to an example embodiment of the present invention.

FIG. 12 is a partially cut-away perspective view illustrating an acoustic wave device according to an example embodiment of the present disclosure. In FIG. 12, the broken line denotes an outer periphery of the void portion 9. The acoustic device of the present disclosure may use plate waves. In this case, as shown in FIG. 12, an acoustic wave device 301 has reflectors 310, 311. The reflectors 310, 311 are provided on both sides of the electrode fingers 3, 4 on the piezoelectric layer 2 in the acoustic wave propagation direction. In the acoustic wave device 301, Lamb waves as plate waves are excited by application of an alternating current electric field to the electrode fingers 3, 4 above the void portion 9. Then, because the reflectors 310, 311 are provided on both sides, resonance characteristics can be obtained with the Lamb waves as plate waves.

Figure 13:
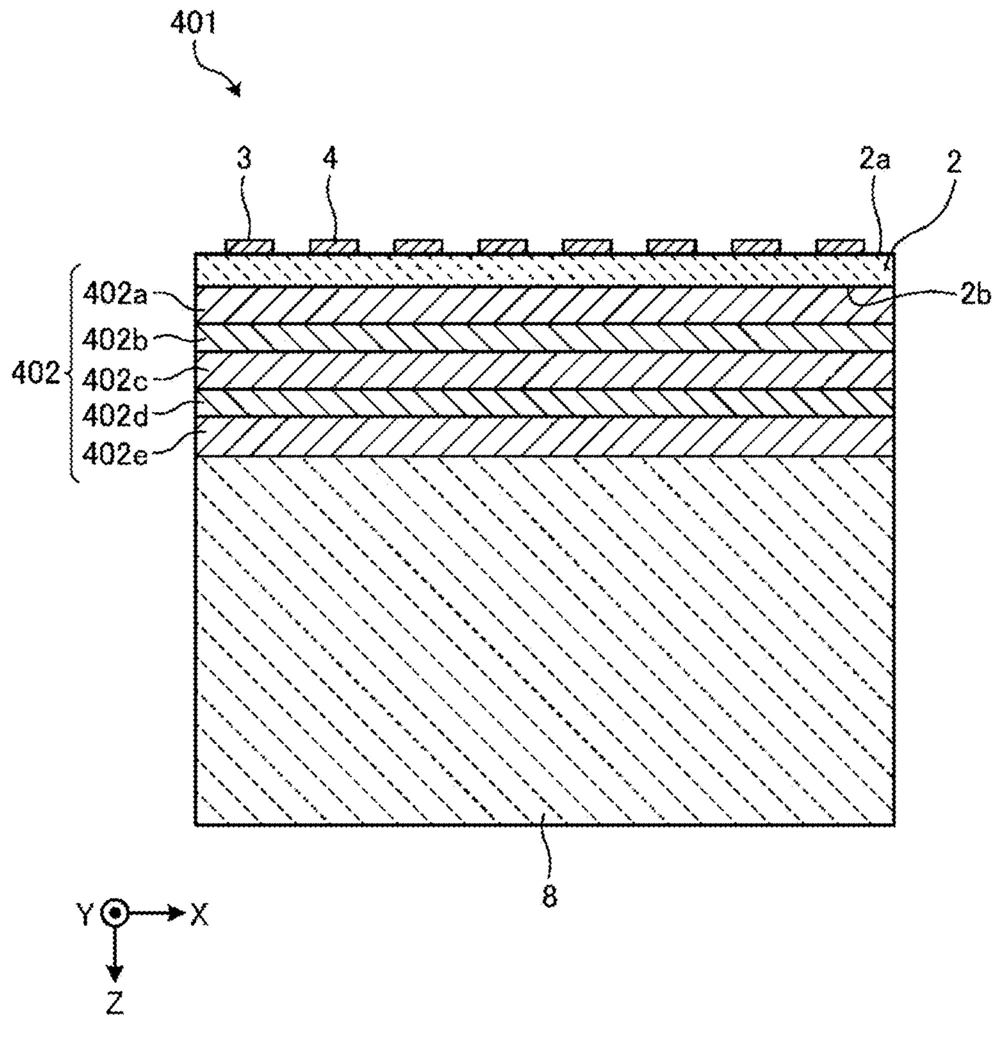
FIG. 13 is a modification of the first example embodiment of the present invention, and is sectional view taken along the line II-II in FIG. 1A.

FIG. 13 is a modification of the first example embodiment, and is a sectional view taken along the line II-II in FIG. 1A. In an acoustic wave device 401, an acoustic reflection layer 402 is laminated on a second main surface 2*b* of a piezoelectric layer 2. The acoustic reflection layer 402 has a laminate structure including low acoustic impedance layers 402*a*, 402*c*, and 402*e* and high acoustic impedance layers 402*b* and 402*d*. The low acoustic impedance layers 402*a*, 402*c*, and 402*e* are layers with relatively low acoustic impedance, and are layers formed of $SiO_2$, for example. The high acoustic impedance layers 402*b* and 402*d* are layers with relatively high acoustic impedance, and are metal layers formed of W, Pt, or the like, or a dielectric layer formed of AlN, SiN, or the like. In a case where the acoustic reflection layer 402 is used, bulk waves of the first-order thickness-shear mode can be confined in the piezoelectric layer 2 without providing the void 9 of the acoustic wave device 1. In the acoustic wave device 401, too, the resonance characteristics based on the bulk waves of the first-order thickness-shear mode can be obtained by setting d/p described above to be about 0.5 or below, for example. Note that in the acoustic reflection layer 402, the number of low acoustic impedance layers 402*a*, 402*c*, and 402*e*, and high acoustic impedance layers 402*b* and 402*d* in the laminate is not particularly limited. Any number of layers may be used as long as at least one of the high acoustic impedance layers 402*b* and 402*d* is arranged farther from the piezoelectric layer 2 than the low acoustic impedance layers 402*a*, 402*c*, or 402*e*.

The material of the low acoustic impedance layers 402*a*, 402*c*, and 402*e* and the high acoustic impedance layers 402*b* and 402*d* is not limited to those described above, and appropriate materials may be used as long as the relation of magnitude of acoustic impedance is satisfied. Examples of a material of the low acoustic impedance layers 402*a*, 402*c*, and 402*e* include silicon oxide, silicon oxynitride, and the like. Examples of a material of the high acoustic impedance layers 402*b* and 402*d* include alumina, silicon nitride, metals, and the like.

As described above, in the acoustic wave devices 1, 101, bulk waves of the first-order thickness-shear mode are used. Also, in the acoustic wave devices 1, 101, the first electrode finger 3 and the second electrode finger 4 are adjacent electrodes, and d/p is set to be about 0.5 or below, for example, where d is the thickness of the piezoelectric layer 2 and p is the center-to-center distance between the first electrode finger 3 and the second electrode finger 4. Thus, the Q factor can be increased even if the acoustic wave device is reduced in device size.

In the acoustic wave devices 1, 101, the piezoelectric layer 2 is formed of lithium niobate or lithium tantalate. The first electrode fingers 3 and the second electrode fingers 4 facing each other in a direction intersecting with the thickness direction of the piezoelectric layer 2 are on the first main surface 2*a* or the second main surface 2*b* of the piezoelectric layer 2, and it is desirable that the first electrode fingers 3 and the second electrode fingers 4 be covered by a protective film from above.

Figure 14:
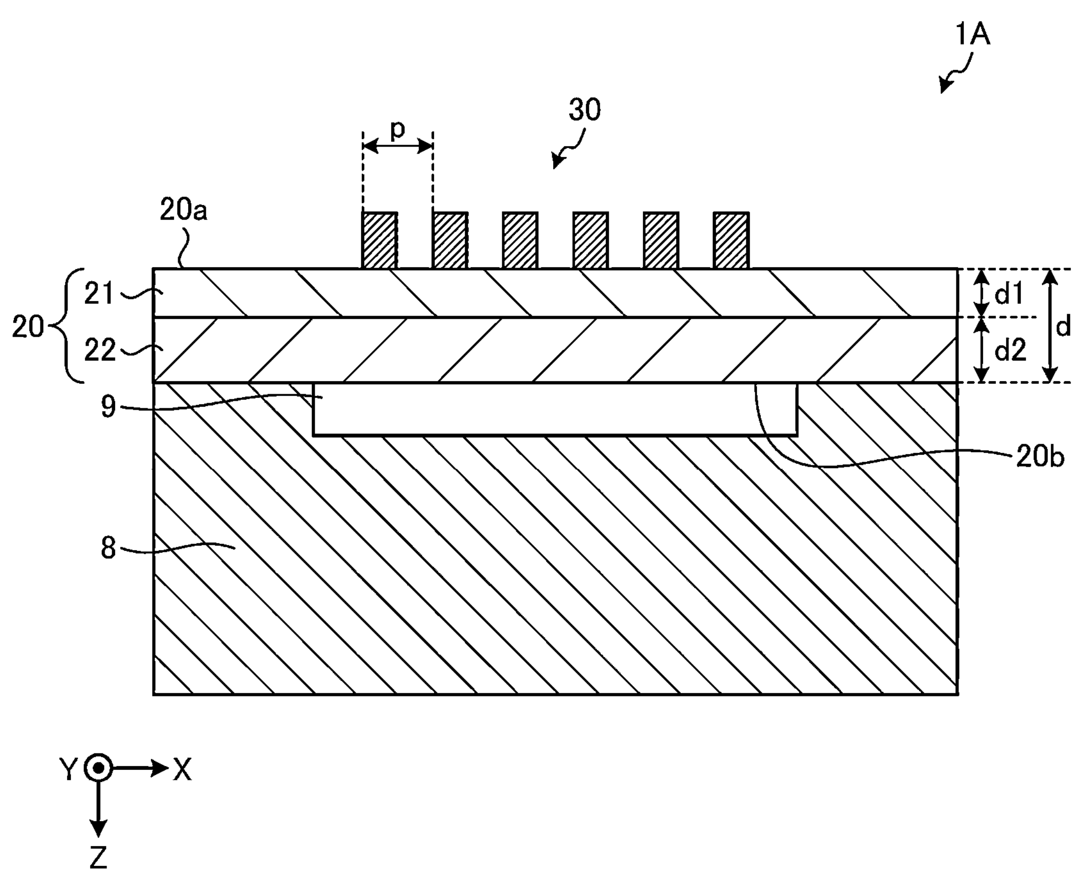
FIG. 14 is a schematic sectional view showing an example of the acoustic wave device according to the first example embodiment of the present invention.

FIG. 14 is a schematic sectional view showing an example of the acoustic wave device according to the first example embodiment. As shown in FIG. 14, an acoustic wave device 1A according to the first example embodiment includes a piezoelectric layer 20, a functional electrode 30, and a support. In the descriptions below, of the directions parallel to the Z-direction, the direction from a second main surface 20*b* of the piezoelectric layer 20 toward a first main surface 20*a* may be described as upward, and the direction from the first main surface 20*a* of the piezoelectric layer 20 toward the second main surface 20*b* may be described as downward.

The functional electrode 30 is an IDT electrode including electrode fingers 3 and 4 and busbar electrodes 5 and 6. The functional electrode 30 is provided on the first main surface 20*a* of the piezoelectric layer 20 described later.

The support includes a support substrate 8. In the acoustic wave device 1A according to FIG. 14, the support includes the support substrate 8, but is not limited to this, and may further include an intermediate layer 7 provided in the Z-direction of the support substrate 8.

The support includes a void 9 at a position where at least a portion thereof overlaps with the functional electrode 30 in a plan view in the Z-direction. In the acoustic wave device 1A according to FIG. 14, the void 9 is provided on the piezoelectric layer 20 side of the support. However, this is merely an example, and the void 9 may be provided so as to penetrate the support substrate 8 in the Z-direction.

The piezoelectric layer 20 is provided in the Z-direction of the support. The piezoelectric layer 20 has a first main surface 20*a*, and a second main surface 20*b* on the opposite side of the first main surface 20*a* in the Z-direction. In the acoustic wave device 1A according to FIG. 14, the piezoelectric layer 20 is provided in the Z-direction of the support substrate 8.

The piezoelectric layer 20 is a piezoelectric laminated structure, i.e., a multilayer body of a plurality of piezoelectric bodies. The piezoelectric layer 20 includes a first piezoelectric body 21 and a second piezoelectric body 22. The first piezoelectric body 21 is a piezoelectric body having the functional electrode 30 provided on a Z-direction surface thereof. In other words, one surface of the first piezoelectric body 21 is the first main surface 20*a* of the piezoelectric layer 20. The second piezoelectric body 22 is a piezoelectric body laminated on the first piezoelectric body 21. In the first example embodiment, a surface of the second piezoelectric body 22 on the support substrate 8 side is the second main surface 20*b* of the piezoelectric layer 20. The first piezoelectric body 21 and the second piezoelectric body 22 are formed of materials of the same composition, and are YX-cut lithium niobate, for example.

In the piezoelectric layer 20, the first piezoelectric body 21 and the second piezoelectric body 22 have different states of dielectric polarization. Here, having different states of dielectric polarization means having different directions of dielectric polarization. In the acoustic wave device 1A according to FIG. 14, the direction of dielectric polarization of the first piezoelectric body 21 is upward, whereas the direction of dielectric polarization of the second piezoelectric body 22 is downward opposite to that of the first piezoelectric body 21. Thus, the coupling coefficient of an S2 mode which is the main mode can be kept large.

Here, d1 is d2 or below where d1 is the thickness of the first piezoelectric body 21, and d2 is the thickness of the second piezoelectric body 22. In other words, a ratio d1/d of the thickness d1 of the first piezoelectric body 21 to the sum of the thickness d1 of the first piezoelectric body 21 and the thickness d2 of the second piezoelectric body 22 (i.e., the thickness d of the piezoelectric layer 20) is about 0.5 or below, for example. Thus, an Al mode which is undesired waves can be curbed and degradation of frequency characteristics can be curbed. Also, it is preferable to set the ratio d1/d of the thickness of the first piezoelectric body 21 to be about 0.2 or above and about 0.4 or below, for example, because the Al mode which is undesired waves can be curbed even more. It is also preferable to set the ratio d1/d of the thickness of the first piezoelectric body 21 to be above about 0.4 and about 0.5 or below, for example, because the coupling coefficient of the S2 mode which is the main mode can be kept even larger.

The state of dielectric polarization of the piezoelectric layer 20 can be observed by scanning probe microscopy (SPM). Specifically, in the piezo response microscope (PRM) image of the cross section of the piezoelectric layer 20, regions with different directions of dielectric polarization appear as regions with different colors. Thus, the thickness d1 of the first piezoelectric body 21 and the thickness d2 of the second piezoelectric body 22 can be measured.

Figure 15:
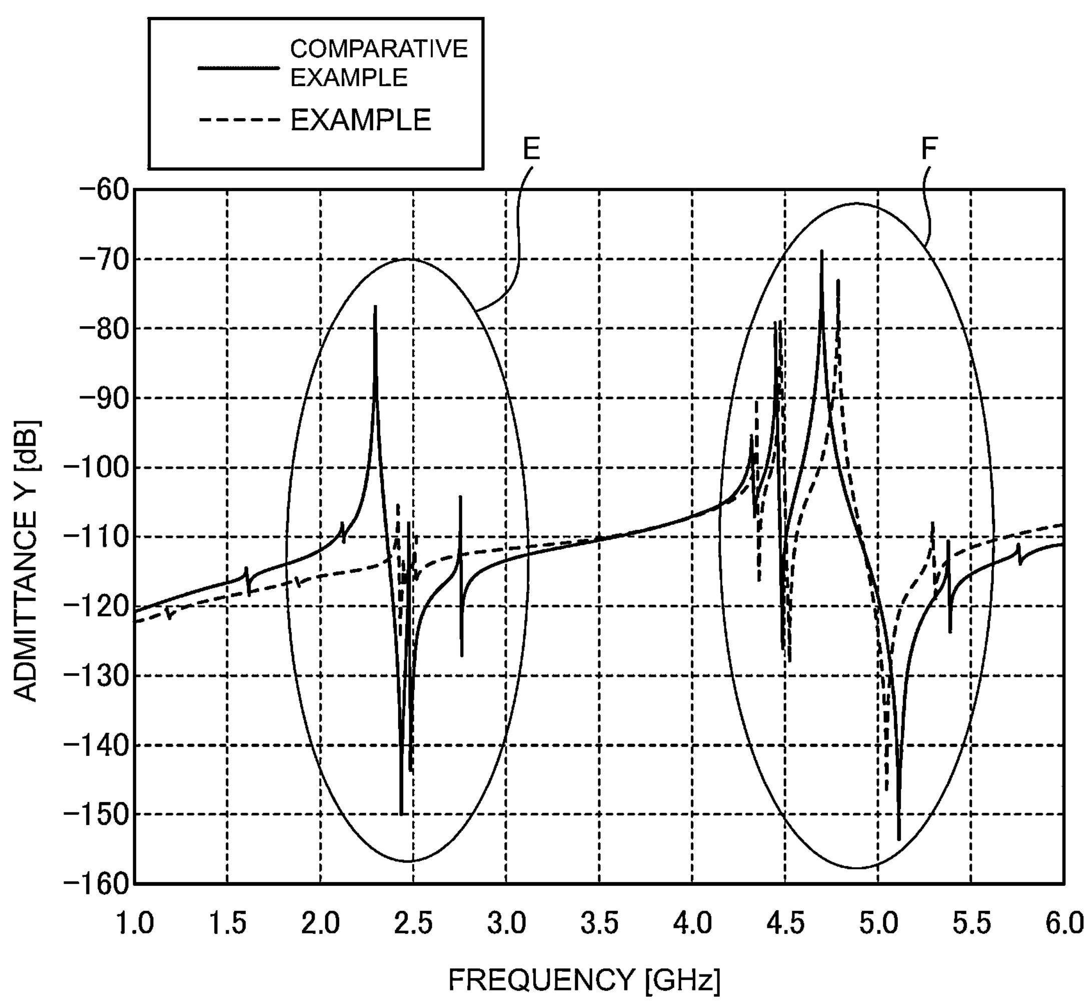
FIG. 15 is an explanatory diagram illustrating filter characteristics of the acoustic wave device according to the first example embodiment of the present invention.

FIG. 15 is an explanatory diagram illustrating filter characteristics of the acoustic wave device according to the first example embodiment. More specifically, FIG. 15 is an explanatory diagram showing admittance characteristics of acoustic wave devices according to a comparative example in which the ratio d1/d of the thickness of a first piezoelectric body 21 is about 0.6 and an example in which the ratio d1/d of the thickness of a first piezoelectric body 21 is about 0.4, for example. Here, in FIG. 15, an oval E indicates the Al mode which is undesired waves, and an oval F indicates the S2 mode which is the main waves. As shown in FIG. 15, in the acoustic wave device according to the comparative example in which the ratio d1/d of the thickness of the first piezoelectric body 21 is about 0.6, for example, the Al mode is not curbed and the Al mode is strongly generated on the low-frequency side of the S2 mode. On the other hand, in the acoustic wave device according to the example in which the ratio d1/d of the thickness of the first piezoelectric body 21 is about 0.4, for example, the Al mode can be curbed without curbing the S2 mode.

Figure 16:
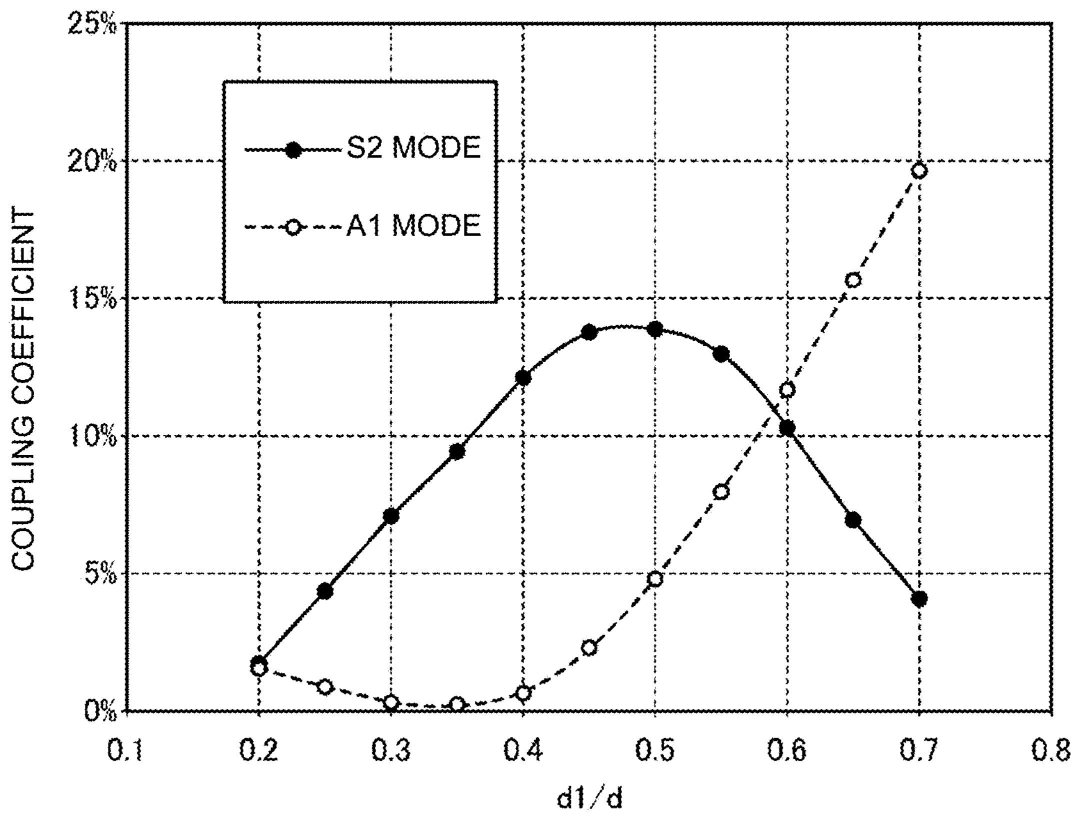
FIG. 16 is an explanatory diagram illustrating the coupling coefficient of the acoustic wave device according to the first example embodiment of the present invention.

FIG. 16 is an explanatory diagram illustrating the coupling coefficient of the acoustic wave device according to the first example embodiment. More specifically, FIG. 16 is a graph showing a simulation result of coupling coefficients of the Al mode and the S2 mode for the ratio d1/d of the thickness of the first piezoelectric body 21. Here, in the simulation according to FIG. 16, the thickness d of a piezoelectric layer 20 is about 800 nm and the pitch p of electrode fingers 3 and 4 is about 8000 nm, for example. As shown in FIG. 16, in a case where the ratio d1/d of the thickness of the first piezoelectric body 21 is about 0.5 or below, for example, the coupling coefficient of the Al mode can be curbed. Also, in a case where the ratio d1/d of the thickness of the first piezoelectric body 21 is about 0.4 or below, for example, the coupling coefficient of the Al mode can be curbed even more. Moreover, in a case where the ratio d1/d of the thickness of the first piezoelectric body 21 is above about 0.4 and about 0.5 or below, for example, the coupling coefficient of the S2 mode can be kept large while curbing the coupling coefficient of the Al mode.

Figure 17:
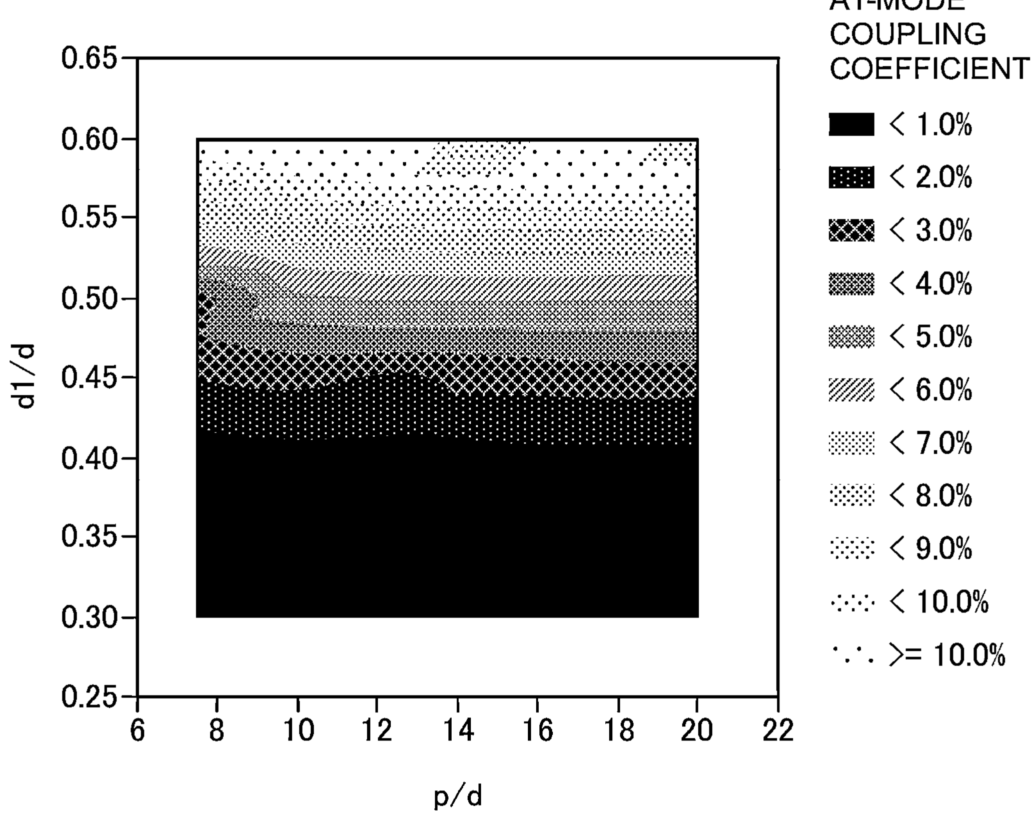
FIG. 17 is an explanatory diagram illustrating the coupling coefficient of the acoustic wave device according to the first example embodiment of the present invention.

FIG. 17 is an explanatory diagram illustrating the coupling coefficient of the acoustic wave device according to the first example embodiment. More specifically, FIG. 17 is an explanatory diagram showing a simulation result of the coupling coefficient of the Al mode corresponding to the ratio d1/d of the thickness of the first piezoelectric body 21 and a ratio p/d of the pitch p of the electrode fingers 3 and 4 to the thickness d of the piezoelectric layer 20. As shown in FIG. 17, regardless of the value of the ratio p/d of the pitch p of the electrode fingers 3 and 4 to the thickness d of the piezoelectric layer 20, in a case where the ratio d1/d of the thickness of first piezoelectric body 21 is about 0.5 or below, for example, the coupling coefficient of the Al mode can be curbed, and in a case where the ratio d1/d of the thickness of the first piezoelectric body 21 is about 0.4 or below, for example, the coupling coefficient of the Al mode can be curbed even more.

Although the acoustic wave device according to the first example embodiment has been described above, the acoustic wave device according to the first example embodiment is not limited to that shown in FIG. 14.

Figure 18:
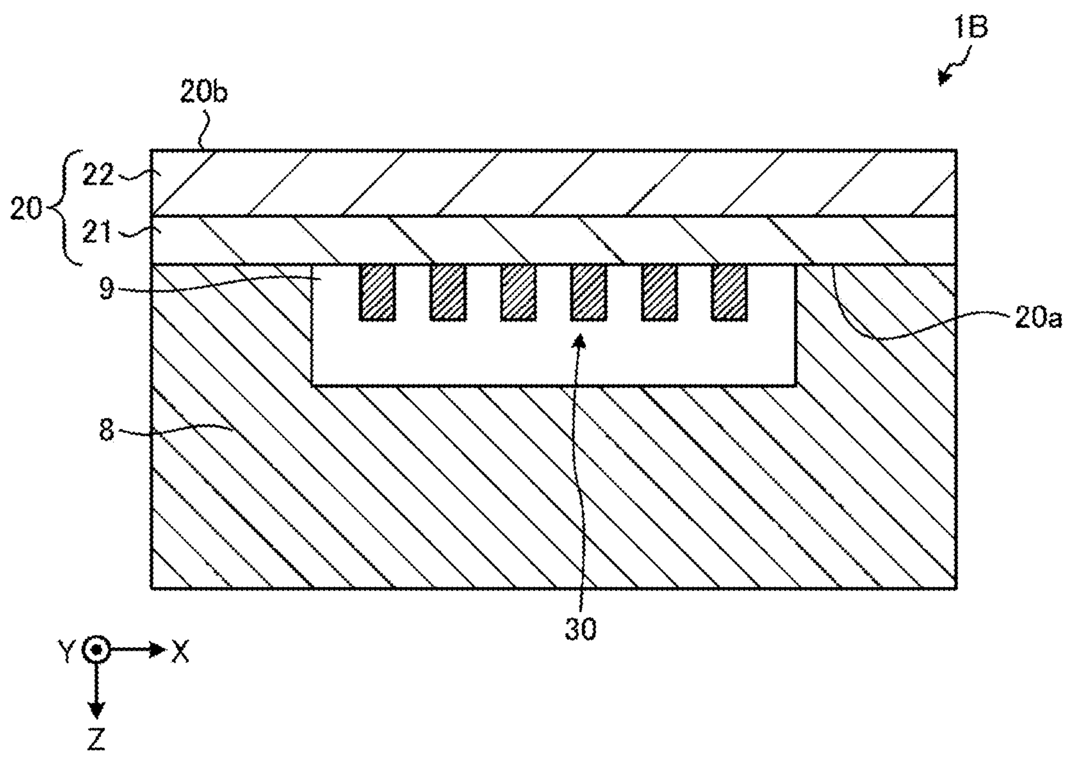
FIG. 18 is a schematic sectional view showing another example of the acoustic wave device according to the first example embodiment of the present invention.

FIG. 18 is a schematic sectional view showing another example of the acoustic wave device according to the first example embodiment. As shown in FIG. 18, a functional electrode 30 may be provided inside a void 9. In an acoustic wave device 1B shown in FIG. 18, a support substrate 8 is laminated on a first main surface 20*a* side of a piezoelectric layer 2. In this case, too, the Al mode which is undesired waves can be curbed and degradation of frequency characteristics can be curbed.

As described above, the acoustic wave device according to the first example embodiment includes the support with a thickness in a first direction, the piezoelectric layer 20 extending in the first direction of the support, and the functional electrode 30 on the main surface of the piezoelectric layer 20 and including one or more first electrode fingers 3 extending in a second direction intersecting with the first direction, a first busbar electrode 5 to which the one or more first electrode fingers 3 are connected, one or more second electrode fingers 4 facing any of the one or more first electrode fingers 3 in a third direction perpendicular or substantially perpendicular the second direction and extending in the second direction, and a second busbar electrode 6 to which the one or more second electrode fingers 4 are connected, the piezoelectric layer 2 being a piezoelectric laminated structure including the first piezoelectric body 21 in contact with the functional electrode 30 and the second piezoelectric body 22 with a state of dielectric polarization different from the first piezoelectric body 21, and the thickness d1 of the first piezoelectric body 21 being less than or equal to the thickness d2 of the second piezoelectric body 22. This makes it possible to curb the Al mode which is undesired waves while keeping the S2 mode which is the main mode large, and curb degradation of frequency characteristics.

It is preferred that the ratio of the thickness d1 of the first piezoelectric body 21 to the sum of the thickness d1 of the first piezoelectric body 21 and the thickness d2 of the second piezoelectric body 22 (the thickness d of the piezoelectric layer 20) is about 0.2 or above and about 0.4 or below, for example. This makes it possible to curb the Al mode which is undesired waves even more, and curb degradation of frequency characteristics even more.

It is preferred that the ratio of the thickness d1 of the first piezoelectric body 21 to the sum of the thickness d1 of the first piezoelectric body 21 and the thickness d2 of the second piezoelectric body 22 (the thickness d of the piezoelectric layer 20) is above about 0.4 and about 0.5 or below, for example. This makes it possible to keep the coupling coefficient of the S2 mode even larger while curbing the Al mode which is undesired waves even more.

It is preferred that on the piezoelectric layer 20 side of the support, the void 9 is provided at a position where the void 9 at least partially overlaps with the functional electrode 30 in a plan view in the first direction. This makes it possible to confine bulk waves of the first-order thickness-shear mode in the piezoelectric layer 2.

Moreover, the functional electrode 30 is provided inside the void 9. This also makes it possible to confine bulk waves of the first-order thickness-shear mode in the piezoelectric layer 20.

It is preferred that there is provided the acoustic reflection layer 402 provided between the support and the piezoelectric layer 2, and including one or more low acoustic impedance layers 402*a*, 402*c*, and 402*e* having lower acoustic impedance than the piezoelectric layer 2 and one or more high acoustic impedance layers 402*b* and 402*d* having higher acoustic impedance than the piezoelectric layer 2. This makes it possible to confine bulk waves of the first-order thickness-shear mode in the piezoelectric layer 2.

It is preferred that the thickness of the piezoelectric layer 2 is 2p or below where p is the center-to-center distance between adjacent ones of the first electrode finger 3 and the second electrode finger 4 among one or more the first electrode finger 3 and one or more second electrode finger 4. This enables device size reduction of the acoustic wave device 1 and also increase of the Q factor.

It is preferred that the piezoelectric layer 2 includes lithium niobate or lithium tantalate. This makes it possible to provide an acoustic wave device with which favorable resonance characteristics can be obtained.

It is preferred that the acoustic wave device is configured to generate bulk waves of a thickness-shear mode. This makes it possible to provide an acoustic wave device which has a large coupling coefficient and with which favorable resonance characteristics can be obtained.

Further, it is preferred that d/p is about 0.5 or below, for example, where d is the thickness of the piezoelectric layer 2 and p is the center-to-center distance between adjacent ones of the first electrode finger 3 and the second electrode finger 4 among one or more the first electrode finger 3 and one or more second electrode finger 4. This enables device size reduction of the acoustic wave device 1 and also increase of the Q factor.

It is even more preferred that d/p is about 0.24 or below, for example. This enables device size reduction of the acoustic wave device 1 and also increase of the Q factor.

It is preferred that the piezoelectric layer 2 includes lithium niobate or lithium tantalate, and the Euler angles (p, θ, ψ) of the lithium niobate or the lithium tantalate are within the ranges of Formula (1), (2), or (3) below. In this case, the fractional band width can be widened sufficiently.

$$(0° \pm 10°,\ 0° \text{ to } 20°,\ \text{any given } \psi) \qquad \text{Formula (1)}$$

$$\left(0° \pm 10°,\ 20° \text{ to } 80°,\ 0° \text{ to } 60° \left(1-(\theta-50)^2/900\right)^{1/2}\right) \text{ or} \qquad \text{Formula (2)}$$

$$\left(0° \pm 10°,\ 20° \text{ to } 80°,\ \left[180° - 60° \left(1-(\theta-50)^2/900\right)^{1/2}\right] \text{ to } 180°\right)$$

$$\text{Formula (3)}$$

$$\left(0° \pm 10°,\ \left[180° - 30° \left(1-(\psi-90)^2/8100\right)^{1/2}\right] \text{ to } 180°,\ \text{any given } \psi\right)$$

It is preferred that the excitation region C is a region where, among the one or more first electrode fingers 3 and the one or more second electrode fingers 4, the first electrode finger 3 and the second electrode finger 4 adjacent to each other overlap when seen in a direction in which the electrode finger 3 and the electrode finger 4 face each other, and the acoustic wave device satisfies MR≤about 1.75(d/p)+0.075, for example, where MR is the metallization ratio of the one or more first electrode fingers 3 and the one or more second electrode fingers 4 to the excitation region C. In this case, the fractional band width can be reliably brought to about 17% or below, for example.

Second Example Embodiment

An acoustic wave device according to a second example embodiment is different from the first example embodiment in that it includes a dielectric film 19. The dielectric film 19 is made of a dielectric, and is a film formed of silicon oxide, for example. Hereinafter, the acoustic wave device according to the second example embodiment will be described with reference to the drawings. Note that matters common to the first example embodiment are marked with reference signs and descriptions thereof are omitted.

Figure 19:
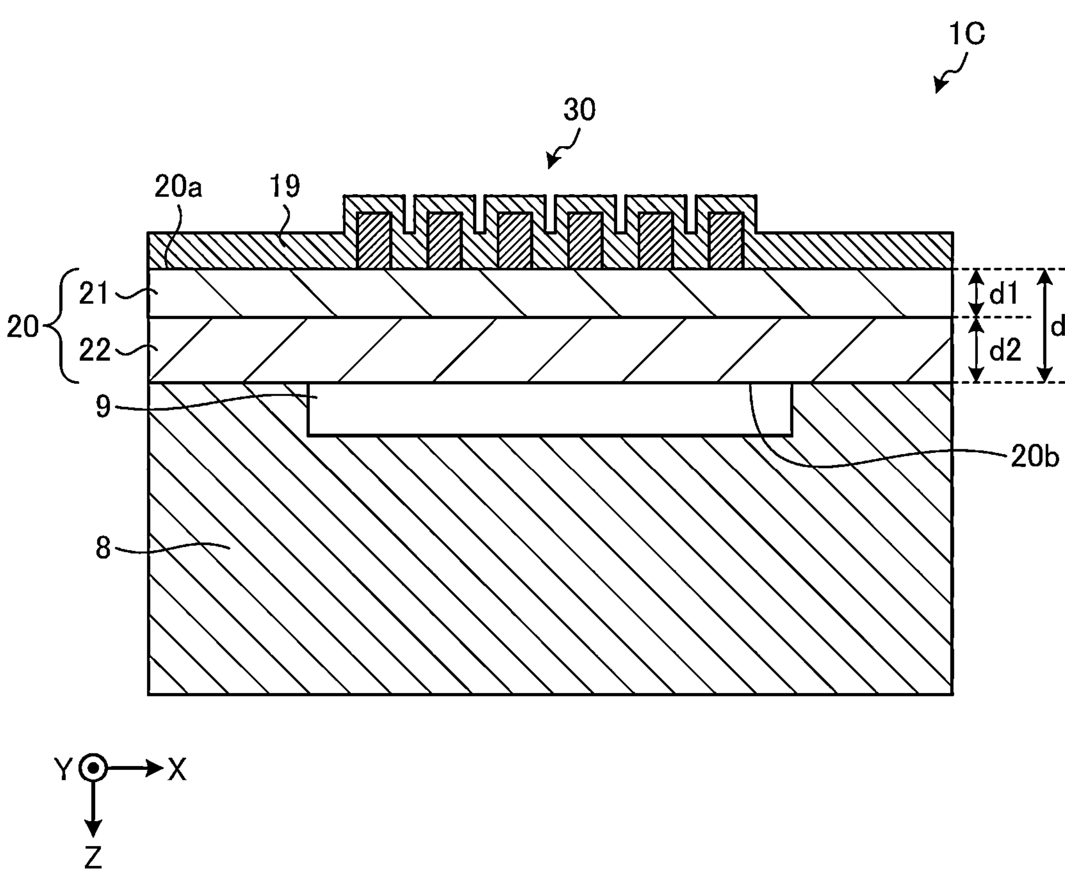
FIG. 19 is a schematic sectional view showing an example of an acoustic wave device according to a second example embodiment of the present invention.

FIG. 19 is a schematic sectional view showing an example of an acoustic wave device according to a second example embodiment. In an acoustic wave device 1C according to the second example embodiment, the dielectric film 19 is provided so as to cover a first piezoelectric body 21. More specifically, the dielectric film 19 is provided so as to cover a first main surface 20*a* and a functional electrode 30 of a piezoelectric layer 20.

Figure 20:
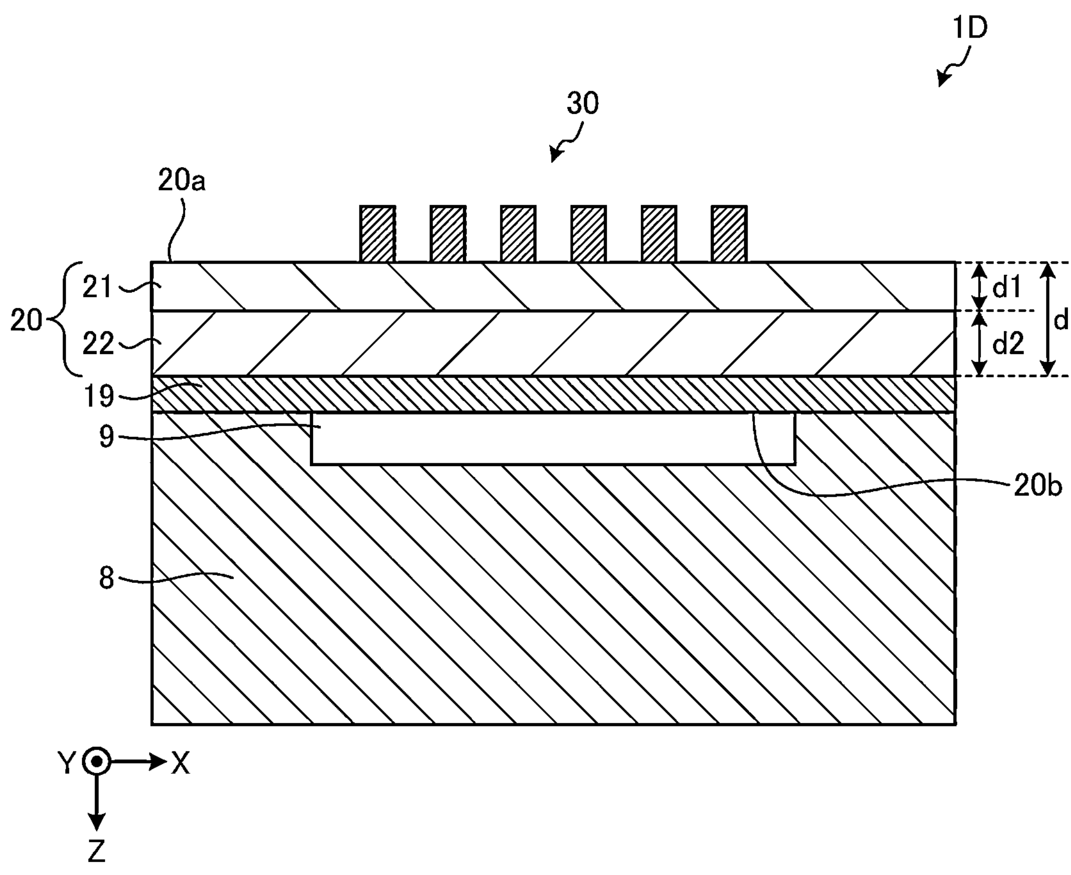
FIG. 20 is a schematic sectional view showing another example of the acoustic wave device according to the second example embodiment of the present invention.

FIG. 20 is a schematic sectional view showing another example of the acoustic wave device according to the second example embodiment. In an acoustic wave device 1D according to the second example embodiment, a dielectric film 19 is provided so as to cover a second piezoelectric body 22. More specifically, the dielectric film 19 is provided so as to cover a first main surface 20*a* and a functional electrode 30 of a piezoelectric layer 20.

Figure 21:
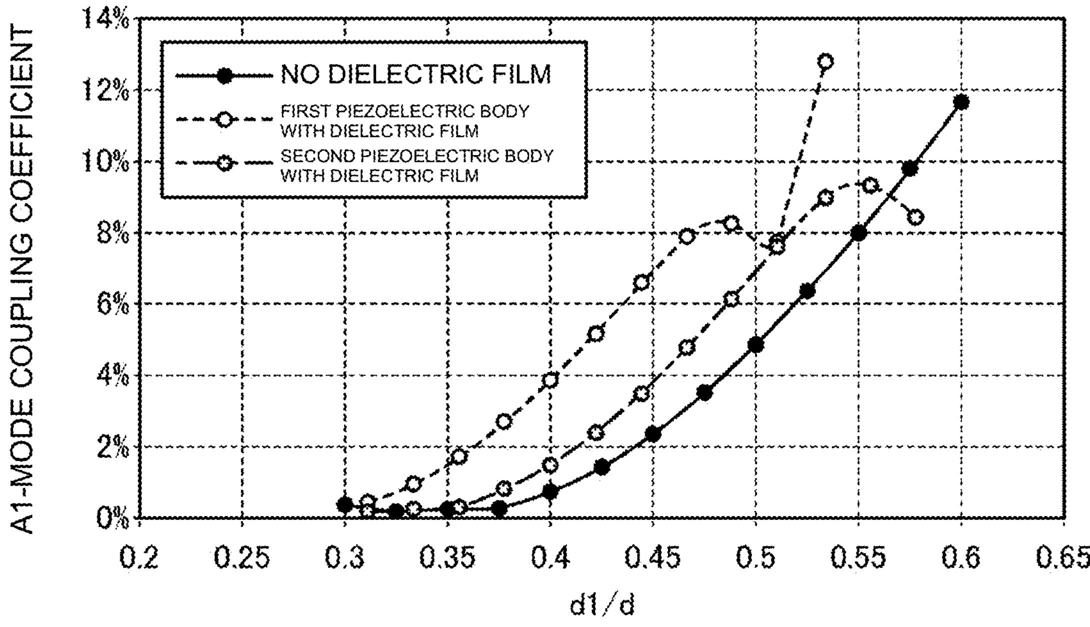
FIG. 21 is an explanatory diagram illustrating the coupling coefficient of the acoustic wave device according to the second example embodiment of the present invention.

FIG. 21 is an explanatory diagram illustrating the coupling coefficient of the acoustic wave device according to the second example embodiment. More specifically, FIG. 21 shows a simulation result of the coupling coefficient of the Al mode for the ratio d1/d of the thickness of the first piezoelectric body 21 in an acoustic wave device without the dielectric film 19 (the acoustic wave device 1A according to the first example embodiment), the acoustic wave device 1C including the dielectric film 19 covering the first piezoelectric body 21, and the acoustic wave device 1D including the dielectric film 19 covering the second piezoelectric body 22. Here, in the simulation according to FIG. 21, the thickness d of the piezoelectric layer 20 is about 800 nm and the thickness of the dielectric film 19 is about 100 nm, for example. As shown in FIG. 21, even if the dielectric film 19 is provided, the coupling coefficient of the Al mode can be curbed when the ratio d1/d of the thickness of the first piezoelectric body 21 is about 0.5 or below, and the coupling coefficient of the Al mode can be curbed even more when the ratio d1/d of the thickness of the first piezoelectric body 21 is about 0.4 or below, for example.

As described above, the acoustic wave device 1C according to the second example embodiment includes the dielectric film 19 covering the first piezoelectric body 21. In this case, too, the Al mode which is undesired waves can be curbed while keeping the coupling coefficient of the S2 mode which is the main mode large, and degradation of frequency characteristics can be curbed.

As described above, the acoustic wave device 1D according to the second example embodiment includes the dielectric film 19 covering the second piezoelectric body 22. In this case, too, the Al mode which is undesired waves can be curbed while keeping the coupling coefficient of the S2 mode which is the main mode large, and degradation of frequency characteristics can be curbed.

Third Example Embodiment

An acoustic wave device according to a third example embodiment is different from the first example embodiment in that the piezoelectric layer includes three or more layers of piezoelectric bodies. Hereinafter, the acoustic wave device according to the third example embodiment will be described with reference to the drawings. Note that matters common to the first example embodiment are marked with reference signs and descriptions thereof are omitted.

Figure 22:
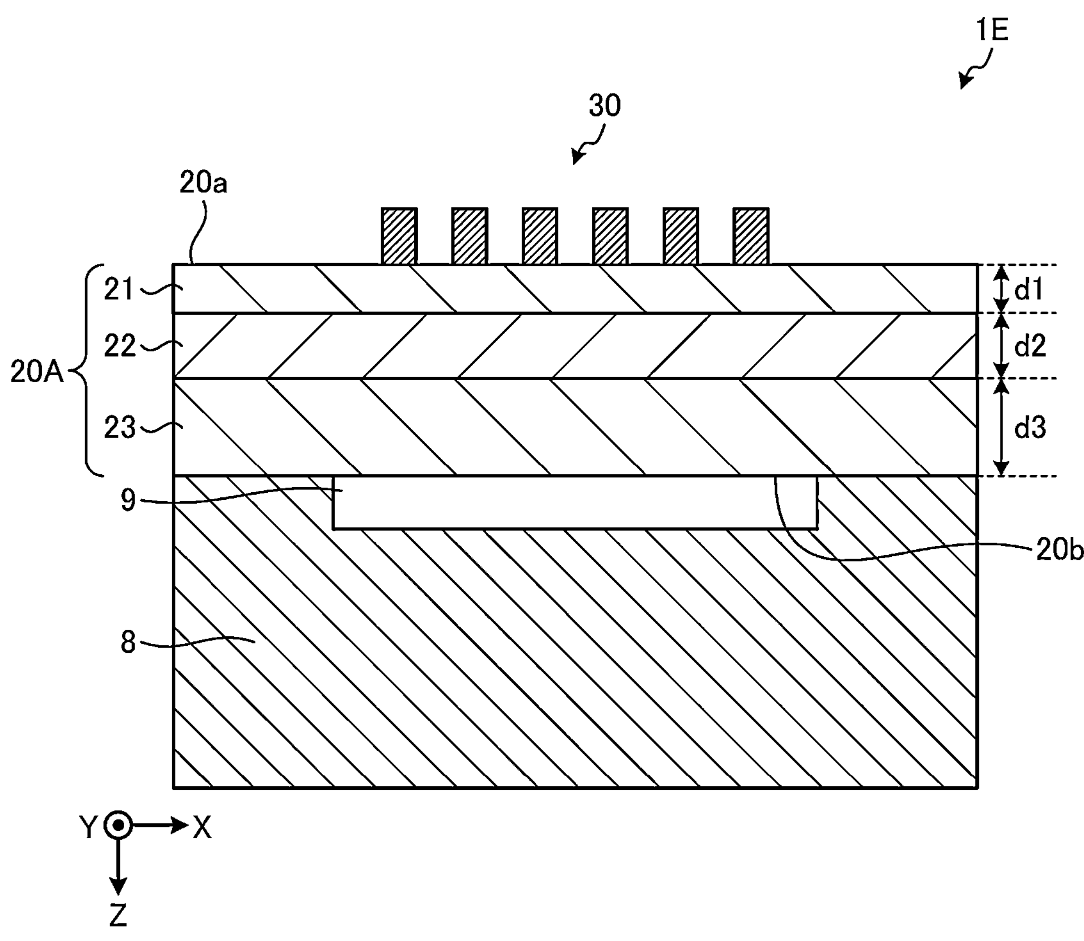
FIG. 22 is a schematic sectional view showing an example of an acoustic wave device according to a third example embodiment of the present invention.

FIG. 22 is a schematic sectional view showing an example of the acoustic wave device according to the third example embodiment. As shown in FIG. 22, in the third example embodiment, a piezoelectric layer 20A has n layers of piezoelectric bodies. Here, n is an integer of three or more. Hereinafter, in the piezoelectric layer 20A, the layers will be counted in the Z-direction from a first piezoelectric body 21, by referring to the piezoelectric body laminated at the nth layer as the nth piezoelectric body and the piezoelectric body laminated at the kth layer as the kth piezoelectric body. Here, k is any one of the integers 1 to n−1. In other words, the piezoelectric layer 20A includes first to nth piezoelectric bodies. Here, the first piezoelectric body is the first piezoelectric body 21 and the second piezoelectric body is a second piezoelectric body 22. In the third example embodiment, a surface of the nth piezoelectric body on a support substrate 8 side is a second main surface 20*b* of the piezoelectric layer 20A. In the third example embodiment, the first to nth piezoelectric bodies are all formed of materials of the same composition, and are YX-cut lithium niobate, for example.

In an acoustic wave device 1E according to FIG. 22, the piezoelectric layer 20A includes the first piezoelectric body 21, the second piezoelectric body 22, and a third piezoelectric body 23. The third piezoelectric body 23 is the nth piezoelectric body and is the third piezoelectric body. In other words, in the acoustic wave device 1E, n is equal to three. A surface of the third piezoelectric body 23 on the support substrate 8 side is the second main surface 20*b* of the piezoelectric layer 20A.

In the piezoelectric layer 20A, piezoelectric bodies adjacent to each other have different states of dielectric polarization. In other words, the kth piezoelectric body and the (k+1)th piezoelectric body have different states of dielectric polarization. Thus, the coupling coefficient of the main mode can be kept large.

In the acoustic wave device 1E according to FIG. 22, the direction of dielectric polarization of the first piezoelectric body 21 is upward. On the other hand, the direction of dielectric polarization of the second piezoelectric body 22 is downward opposite to that of the first piezoelectric body 21. The direction of dielectric polarization of the third piezoelectric body 23 is upward opposite to that of the second piezoelectric body 22. Thus, the coupling coefficient of the main mode can be kept large.

The thickness d1 of the first piezoelectric body 21 is less than or equal to the thickness of other piezoelectric bodies. In other words, the thickness d1 of the first piezoelectric body 21 is less than or equal to the thickness of the (k+1)th piezoelectric body. That is, the first piezoelectric body 21 is the piezoelectric body having the smallest thickness of the n layers of piezoelectric bodies. Also, dk is d(k+1) or below where dk is the thickness of the kth piezoelectric body, and d(k+1) is the thickness of the (k+1)th piezoelectric body. Thus, undesired waves can be curbed. Moreover, it is preferable that dk is d(k+1) or below for every k. That is, the following Formula (4) preferably holds when the thickness of the nth piezoelectric body is dn. Thus, undesired waves can be curbed even more.

$$d1 \leq d2 \leq \ldots \leq dk \leq d(k+1) \leq \ldots \leq dn \quad \text{Formula (4)}$$

In the acoustic wave device 1E according to FIG. 22, when d3 is the thickness of the third piezoelectric body 23, the thickness d1 of the first piezoelectric body 21 is less than or equal to the thickness d2 of the second piezoelectric body 22, and the thickness d2 of the second piezoelectric body 22 is less than or equal to the thickness d3 of the third piezoelectric body 23. Thus, undesired waves can be curbed.

As described above, in the acoustic wave device according to the third example embodiment, the piezoelectric layer 20A has n layers of piezoelectric bodies where n is an integer of three or more, and when k is any one of integers 1 to n−1, the kth piezoelectric body from the first piezoelectric body 21 and the (k+1)th piezoelectric body from the first piezoelectric body 21 have different states of dielectric polarization. This makes it possible to keep the coupling coefficient of the main mode large and curb deterioration of frequency characteristics.

It is preferred that the thickness d1 of the first piezoelectric body 21 is less than or equal to the thickness of other piezoelectric bodies. This makes it possible to curb undesired waves and curb deterioration of frequency characteristics.

It is preferred that the thickness of the kth piezoelectric body is less than or equal to the thickness of the (k+1)th piezoelectric body. This makes it possible to curb undesired waves and curb deterioration of frequency characteristics.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a support with a thickness in a first direction;

a piezoelectric layer extending in the first direction of the support; and a functional electrode on a main surface of the piezoelectric layer and including one or more first electrode fingers extending in a second direction intersecting with the first direction, a first busbar electrode to which the one or more first electrode fingers are connected, one or more second electrode fingers facing any of the one or more first electrode fingers in a third direction perpendicular or substantially perpendicular the second direction and extending in the second direction, and a second busbar electrode to which the one or more second electrode fingers are connected; wherein the piezoelectric layer is a piezoelectric laminated structure including a first piezoelectric body in contact with the functional electrode and a second piezoelectric body with a state of dielectric polarization different from the first piezoelectric body;

a thickness of the first piezoelectric body is less than or equal to a thickness of the second piezoelectric body; and a ratio of the thickness of the first piezoelectric body to a sum of the thickness of the first piezoelectric body and the thickness of the second piezoelectric body is above 0.2 and about 0.4 or below.

2. The acoustic wave device according to claim 1, further comprising a dielectric film covering the first piezoelectric body.

3. The acoustic wave device according to claim 1, further comprising a dielectric film covering the second piezoelectric body.

4. The acoustic wave device according to claim 1, wherein on a piezoelectric layer side of the support, a void at least partially overlaps with the functional electrode in a plan view in the first direction.

5. The acoustic wave device according to claim 4, wherein the functional electrode is inside the void.

6. The acoustic wave device according to claim 1, further comprising an acoustic reflection layer between the support and the piezoelectric layer, and including one or more low acoustic impedance layers with lower acoustic impedance than the piezoelectric layer and one or more high acoustic impedance layers with higher acoustic impedance than the piezoelectric layer.

7. The acoustic wave device according to claim 1, wherein a total thickness of the piezoelectric layer is about 2p or below where p is a center-to-center distance between adjacent ones of the first electrode finger and the second electrode finger among the one or more first electrode fingers and the one or more second electrode fingers.

8. The acoustic wave device according to claim 1, wherein the piezoelectric layer includes lithium niobate or lithium tantalate.

9. The acoustic wave device according to claim 1, wherein the acoustic wave device is configured to generate a bulk wave of a thickness-shear mode.

10. The acoustic wave device according to claim 1, wherein d/p≤about 0.5 where d is a total thickness of the piezoelectric layer and p is a center-to-center distance between adjacent ones of the first electrode finger and the second electrode finger among the one or more first electrode fingers and the one or more second electrode fingers.

11. The acoustic wave device according to claim 10, wherein d/p is about 0.24 or below.

12. The acoustic wave device according to claim 1, wherein the piezoelectric layer includes lithium niobate or lithium tantalate; and Euler angles (ϕ, θ, ψ) of the lithium niobate or the lithium tantalate are within ranges of $$(0° \pm 10°, 0° \text{ to } 20°, \text{any given } \psi); \quad \text{Formula (1)}$$

$$\left(0° \pm 10°, 20° \text{ to } 80°, 0° \text{ to } 60° \left(1-(\theta-50)^2/900\right)^{1/2}\right) \text{ or } \quad \text{Formula (2)}$$

$$\left(0° \pm 10°, 20° \text{ to } 80°, \left[180° - 60° \left(1-(\theta-50)^2/900\right)^{1/2}\right] \text{ to } 180°\right);$$

$$\text{Formula (3)}$$

$$\left(0° \pm 10°, \left[180° - 30° \left(1-(\psi-90)^2/8100\right)^{1/2}\right] \text{ to } 180°, \text{any given } \psi\right).$$

13. The acoustic wave device according to claim 1, wherein an excitation region is a region where adjacent ones of the first electrode finger and the second electrode finger among the one or more first electrode fingers and the one or more second electrode fingers overlap when seen in a direction in which the first electrode finger and the second electrode finger face each other; and the acoustic wave device satisfies MR≤about 1.75(d/p)+0.075 where MR is a metallization ratio of the one or more first electrode fingers and the one or more second electrode fingers to the excitation region, d is a total thickness of the piezoelectric layer, and p is a center-to-center distance between adjacent ones of the first electrode finger and the second electrode finger among the one or more first electrode fingers and the one or more second electrode fingers.

14. The acoustic wave device according to claim 1, wherein a total thickness of the piezoelectric layer is about 50 nm or above and about 1000 nm or below.

15. The acoustic wave device according to claim 1, wherein a center-to-center distance between one of the first electrode fingers and one of the second electrode fingers is about 1 μm or above to about 10 μm or below.

16. An acoustic wave device comprising:

a support with a thickness in a first direction;

a piezoelectric layer extending in the first direction of the support; and a functional electrode on a main surface of the piezoelectric layer and including one or more first electrode fingers extending in a second direction intersecting with the first direction, a first busbar electrode to which the one or more first electrode fingers are connected, one or more second electrode fingers facing any of the one or more first electrode fingers in a third direction perpendicular or substantially perpendicular the second direction and extending in the second direction, and a second busbar electrode to which the one or more second electrode fingers are connected; wherein the piezoelectric layer is a piezoelectric laminated structure including a first piezoelectric body in contact with the functional electrode and a second piezoelectric body with a state of dielectric polarization different from the first piezoelectric body;

a thickness of the first piezoelectric body is less than or equal to a thickness of the second piezoelectric body; and a ratio of the thickness of the first piezoelectric body to a sum of the thickness of the first piezoelectric body and the thickness of the second piezoelectric body is above about 0.4 and about 0.5 or below.

17. An acoustic wave device comprising:

a support with a thickness in a first direction;

a piezoelectric layer extending in the first direction of the support; and a functional electrode on a main surface of the piezoelectric layer and including one or more first electrode fingers extending in a second direction intersecting with the first direction, a first busbar electrode to which the one or more first electrode fingers are connected, one or more second electrode fingers facing any of the one or more first electrode fingers in a third direction perpendicular or substantially perpendicular the second direction and extending in the second direction, and a second busbar electrode to which the one or more second electrode fingers are connected; wherein the piezoelectric layer is a piezoelectric laminated structure including a first piezoelectric body in contact with the functional electrode and a second piezoelectric body with a state of dielectric polarization different from the first piezoelectric body;

a thickness of the first piezoelectric body is less than or equal to a thickness of the second piezoelectric body; and the first and second piezoelectric bodies are included in n layers of piezoelectric bodies where n is an integer of three or more, and when k is any one of integers 1 to n−1, a kth piezoelectric body from the first piezoelectric body and a (k+1)th piezoelectric body from the first piezoelectric body have different states of dielectric polarization.

18. The acoustic wave device according to claim 17, wherein the thickness of the first piezoelectric body is less than or equal to a thickness of another piezoelectric body.

19. The acoustic wave device according to claim 17, wherein a thickness of the kth piezoelectric body is less than or equal to a thickness of the (k+1)th piezoelectric body.

* * * * *